US012134836B2

(12) United States Patent
Charles et al.

(10) Patent No.: US 12,134,836 B2
(45) Date of Patent: Nov. 5, 2024

(54) METHOD FOR PRODUCING A NITRIDE LAYER

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin D'Heres (FR)

(72) Inventors: Matthew Charles, Grenoble (FR); Guy Feuillet, Grenoble (FR); Roy Dagher, Nice (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 422 days.

(21) Appl. No.: 17/645,516

(22) Filed: Dec. 22, 2021

(65) Prior Publication Data
US 2022/0251730 A1 Aug. 11, 2022

(30) Foreign Application Priority Data

Dec. 22, 2020 (FR) ..................................... 20 13963

(51) Int. Cl.
*C30B 29/40* (2006.01)
*C30B 25/18* (2006.01)

(52) U.S. Cl.
CPC .......... *C30B 29/406* (2013.01); *C30B 25/183* (2013.01); *C30B 25/186* (2013.01)

(58) Field of Classification Search
CPC ... C30B 29/406; C30B 25/183; C30B 25/186; H01L 33/007; H01L 21/02381;
(Continued)

(56) References Cited

U.S. PATENT DOCUMENTS 9,196,783 B2* 11/2015 Lagrange ............... B82Y 10/00
2013/0020594 A1* 1/2013 Ahn ..................... H01L 33/0093
438/33
(Continued)

FOREIGN PATENT DOCUMENTS

WO WO 2019/122461 A1 6/2019

OTHER PUBLICATIONS

French Preliminary Search Report issued Sep. 23, 2021 in French Application 20 13963 filed on Dec. 22, 2020, 13 pages (with English Translation of Categories of Cited Documents & Written Opinion).
(Continued)

*Primary Examiner* — Victor A Mandala
(74) *Attorney, Agent, or Firm* — Oblon, McClelland, Maier & Neustadt, L.L.P.

(57) ABSTRACT

A method for producing at least one nitride layer includes providing a stack having a plurality of pillars extending from a substrate of the stack. Each pillar includes at least a crystalline section and a summit having a summit surface area The method also includes growing by epitaxy a crystallite from the summit of some the plurality of pillars and continuing the epitaxial growth of the crystallites until the crystallites supported by the pillars coalesce. The plurality of pillars includes at least one retention pillar and separation pillars. The pillars are configured so that once the nitride layer is formed, the at least one retention pillar retains the nitride layer and some of the separation pillars can fracture.

21 Claims, 10 Drawing Sheets

(58) Field of Classification Search
CPC ........... H01L 21/0245; H01L 21/02458; H01L 21/02505; H01L 33/0093; H01L 21/0254; H01L 21/02639; H01L 21/0265; H01L 29/2003; H01L 29/66462
See application file for complete search history.

(56) References Cited

U.S. PATENT DOCUMENTS

| | | | |
|---|---|---|---|
| 2019/0317400 A1* | 10/2019 | Landis | G03F 7/0002 |
| 2020/0403130 A1* | 12/2020 | Volpert | H01L 33/60 |
| 2021/0164126 A1* | 6/2021 | Feuillet | H01L 33/007 |
| 2022/0359479 A1* | 11/2022 | Feuillet | H01L 27/156 |

OTHER PUBLICATIONS

Dagher et al., "Pendeo-epitaxy of GaN on SOI nano-pillars: Free-standing and relaxed GaN platelets on silicon with a reduced dislocation density", Journal of Crystal Growth 526, 2019, 7 pages.

* cited by examiner

METHOD FOR PRODUCING A NITRIDE LAYER

TECHNICAL FIELD

The invention relates to a method for obtaining a nitride (N) layer, preferably obtained from at least one among gallium (Ga), indium (In), and aluminium (Al). The invention is particularly advantageous in its application in the field of optoelectronic devices comprising a plurality of light-emitting diodes (LED) of micrometric size, generally called microLEDs, or for producing power components such as transistors or power diodes.

STATE OF THE ART

For numerous microelectronic or optoelectronic applications, it is necessary to produce nitride layers from at least one element among gallium, indium, and aluminium. Specific applications relate, for example, to the manufacturing of microLEDs. Other specific applications relate to the manufacturing of power electronics devices, such as power diodes or power transistors, for example transistors of the HEMT-type (acronym for "High Electron Mobility Transistor")

A nitride layer is traditionally obtained by epitaxial growth from a crystalline layer covering a wafer.

A major challenge consists in minimising the density of defects in the nitride layer obtained by epitaxy. Indeed, the performance levels of the microelectronic or optoelectronic devices made from these nitride layers are very sensitive to the density of structural defects, such as dislocations.

These dislocations are caused by the difference of the lattice parameter between the epitaxially grown layer and the substrate, and by the coalescence of the small grains that are formed at the start of the growth; these grains are slightly disoriented with respect to one another, and they join by forming, at the coalescence boundary, dislocations that subsequently spread through the entire epitaxially grown structure.

The most direct manner to solve these issues consists in using substrates that are similar in nature to the layers that are to be epitaxially grown (homo-substrates). However, these substrates are not commercially available or are still of reduced dimensions, which is not conducive to cutting out substrates that are sufficiently large for the industrial applications being considered.

The solutions considered to this day for industrial applications therefore primarily rest on the use of hetero-substrates in combination with methods known as ELOG, for "epitaxial lateral overgrowth". This method, based on the use of a mask to block dislocations, enables to reduce the density of these dislocations. However, these dislocations are distributed in a non-uniform manner, which can be problematic during the manufacturing of the devices.

Another solution consists in regrowing material by epitaxy on the pre-existent pillars of that material: this is called the pendeo-epitaxy method, and it advantageously does not involve the regrowth of the mask. However, traditional pendeo-epitaxy solutions do not enable to eliminate, or even to significantly reduce, the apparition of defects generated by the coalescence of the adjacent seeds.

The patent application WO2019122461 describes a solution that consists in growing a nitride layer on pillars, also called pillars, comprising a flow section topped by a crystalline section. The structure obtained by implementing this method is shown in FIG. 1A. The pillars comprising a flow section 220, a crystalline section 300, and a buffer layer 400 are formed at the surface of a substrate 100. Crystallites are then epitaxially grown at the surface of the pillars 1000. The crystallites join during the coalescence, then form a nitride layer 550 that continues to grow by thickening.

This solution has the disadvantage that, during the cooling of the nitride layer 550, the latter can sometimes feature substantial cracks 6 that run through its thickness. This disadvantage is shown in FIG. 1B. The nitride layer thus obtained is no longer usable. This disadvantage occurs more often when the nitride layer 550 is thick.

There is therefore a substantial need to provide a solution to reduce, and even to eliminate, at least some of the disadvantages of known solutions. The purpose of the present invention is to propose a solution to obtain a layer of nitride (N) obtained from at least one element among gallium (Ga), indium (In), and aluminium (Al), featuring a significantly reduced density of defects and without cracking.

The other objects, characteristics, and advantages of the present invention will be made clearer upon reading the following description in reference to the appended figures. It is understood that other advantages can be integrated.

SUMMARY

To achieve this goal, one embodiment relates to a method for obtaining at least one layer, called nitride layer, made partially at least of one nitride (N) from at least one element among gallium (Ga), indium (In), and aluminium (Al).

The method comprises the following sequence of steps:
providing a stack comprising a plurality of pillars extending from a substrate of the stack, the pillars being distributed on the substrate so as to form at least one assembly of pillars, each pillar comprising at least:
a crystalline section,
a summit, featuring a summit surface, intended to form a seed layer for a subsequent epitaxy step,
growing by epitaxy a crystallite from the summit of some at least of said pillars of the assembly and continuing the epitaxial growth of the crystallites until the crystallites supported by the pillars adjacent to the assembly coalesce, so as to form said nitride layer on the assembly of pillars.

For each assembly, the plurality of pillars comprises at least one pillar, called retention pillar, and several other pillars, called separation pillars.

The at least one retention pillar differs from the separation pillars by at least one parameter taken among:
a summit surface $S_{pillarR}$ of the at least one retention pillar, with $S_{pillarR} \geq 1.2 \ast S_{pillarS}$, $S_{pillarS}$ being the summit surface of the separation pillars,
the materials constituting the at least one retention pillar and the separation pillars, the separation pillars comprising a flow section, made of an amorphous material featuring a glass-transition temperature $T_{glass\ transition}$, the crystalline section topping the flow section, the retention pillars
not having a flow section or
having a flow section that is less thick than the flow section of the separation pillars, or
having a flow section with a glass-transition temperature $T_{glass\ transition}$ that is greater, preferably by at least 1.2 times, than the glass-transition temperature $T_{glass\ transition}$ of the flow section of the separation pillars, a distance $D_R$, $D_R$ being the distance separating the at least one retention pillar from the other retention pillars that are adjacent thereto, and that belong to the assembly of pillars, with $D_R*1.2 \leq D_S$, $D_S$ being the distance separating the adjacent separation pillars belonging to the assembly of pillars.

Thus, the proposed method involves varying the properties of the pillars of an assembly of pillars intended to support a layer. Certain pillars (the separation pillars) are intended to break, by themselves or easily under the action of a mechanical or thermal constraint for example. Other pillars (the retention pillars) are configured not to break under the effect of said constraint. Thus, the expansion differentials imposed by the different coefficients of thermal expansion (CTE) belonging to the materials of the structure, in particular between the nitride and the material of the crystalline layer (for example silicon), are absorbed by the separation pillars that constitute zones of fragility. These separation pillars can thus break under the effect of the difference between the CTE.

It is thus possible to prevent the constraints generated by the CTE differentials, in particular during the cooling phase at the end of the epitaxy, from concentrating in the nitride layer, causing cracks, as shown in FIG. 1B. The proposed method thus enables to prevent the apparition of cracks. This advantage is particularly important when thick nitride layers are produced, since the thicker the layer of nitride, the more it is subject to cracking effects associated with thermal expansion. The proposed method is therefore particularly advantageous when applied to produce power electronics devices with high current densities and high voltages (such as power diodes or HEMT-type power transistors for example), because the nitride layers are thick in these devices. The proposed method therefore provides a practically efficient solution to the problem of obtaining nitride layers, for example with GaN, that feature a thickness of at least 1 μm, and even of at least 5 μm ($10^{-6}$ metres) and up to 10 μm and even more without the apparition of cracks.

Furthermore, the proposed method provides the advantages of the method described in the document WO2019122461, in terms or reducing, and even eliminating, the dislocations at the coalescence boundaries between two crystallites. Thus, the proposed method enables to achieve, in a layer, even a thick layer, low dislocation densities, in some cases as low as $1 \times 10^6$ cm$^{-2}$, which is substantially lower than the dislocation densities obtained with traditional solutions to grow GaN on silicon (Si) or on silicon carbide (SiC) or on sapphire (typically $1 \times 10^8$ to $1 \times 10^6$ cm$^{-2}$))

FIG. 3A is a photography by transmission electron microscopy showing the fracturing of the pillars. On this photo, taken along a cross-section perpendicular to the face of the substrate supporting the pillars, the fracture at each of the flow sections is clearly identifiable.

FIG. 3B is a photo showing a layer, forming a vignette (=platelet/chip) in this case, which is completely detached from the substrate. Each of the pillars supporting the vignette is fractured. It is therefore no longer possible to accurately control the position of this vignette. The traditional pick and place techniques can therefore not be implemented in an accurate and reliable manner. Indeed, the separation of many vignettes from their substrate seems to be relatively random and, in any case, not at all controlled.

Thus, the proposed method can be used to obtain a nitride layer without cracks and without—or with very few—dislocations at grain boundaries, while also preventing the layer from loosening itself in an uncontrolled manner from the substrate, and even from detaching itself therefrom.

Furthermore, the created separation, whether initiated or facilitated at the separation pillars, facilitates the removal of the layer from the substrate.

In short, the proposed method enables to eliminate cracking risks of the obtained nitride layer, risks that are even more important when the nitride layer is thick, and the pillars are thick. This advantage of the proposed method is particularly valuable when producing devices that require thick nitride layers, such as power electronics devices (power diodes or power transistors for example).

Several applications take advantage of this advantageous feature in terms of controlling the position of the nitride layers. A fist particularly advantageous application relates to producing devices based on microLEDs (μ-LEDs). For this application, it is advantageous to produce a very large number of vignettes on the same wafer, and to move these vignettes to other locations, typically using a pick and place technique.

Another application relates to power electronics. For this application, wherein the devices are produced vertically, it is necessary to ensure a good thermal and electric contact between the substrate of the epitaxially grown nitride layer, typically a GaN layer. This condition is not met for layers of GaN on pillars of $SiO_2$, because these pillars introduce a layer made of $SiO_2$ and air, both having very low electric and thermal conductivity. It is therefore necessary to remove the vignettes of GaN from their original silicon substrate, to remove these non-conducting layers, and to attach the vignettes to another substrate to be able to produce vertical devices for power electronics. The use of retention pillars according to the proposed method ensures that all the vignettes remain correctly positioned after the growth, so that they can be successfully removed from the silicon substrate and rearranged as aligned components. This allows compatibility with wafers of 200 mm and even of 300 mm in diameter, ensuring a production of inexpensive and accurately controlled devices.

The proposed method can further include at least one among the following optional characteristics:

According to one example, the at least one retention pillar and the separation pillars are configured so that once the nitride layer is formed, the at least one retention pillar retains the nitride layer. Preferably, the at least one retention pillar retains the nitride layer after the nitride layer is cooled to ambient temperature.

According to one example, the at least one retention pillar and the separation pillars are configured so that once the nitride layer is formed and after the nitride layer is cooled to a temperature at least two times lower than a temperature $T_{epitaxy}$ whereat the epitaxial growth occurs, at least some of the separation pillars, and even all the separation pillars, are fractured.

According to one example, the substrate features a single assembly of pillars, and the substrate supports a single large layer or vignette. Preferably, the single layer extends substantially over the entire surface of the substrate.

According to an alternative and preferred embodiment, the pillars are distributed on the substrate so as to form a plurality of assemblies of pillars, and the step of epitaxial growth is halted before the crystallites belonging to two separate assemblies can start to coalesce, so that the layer formed on each assembly forms a vignette. The vignettes are distant from one another.

Thus, this non-limiting embodiment involves producing several nitride vignettes (made of GaN for example) from assemblies of pillars etched in a stack comprising a crystalline layer intended for the nitride epitaxy and a flow layer. During their epitaxial growth, the crystallites formed at the summit of the pillars of a same assembly of pillars join to form a vignette, each of these vignettes being intended to form an optoelectronic device, such as a microLED for example, or an electronic device, such as a power transistor, for example of the HEMT type, or a power diode. These components can follow either a lateral architecture or a vertical architecture.

This non-limiting embodiment offers a solution that is clearly contrary to all the known solutions of the state of the art, where etching is used to delimit vignettes from an initial common layer obtained by epitaxy. This embodiment enables to totally eliminate a step of etching to delimit the vignettes. Indeed, this etching step is very damaging to the efficiency of devices such as microLEDs. Furthermore, the solutions developed to alleviate, without eliminating, the disadvantages of the etching step considerably complicate the methods and create other disadvantages. This embodiment thus relies on a simple and easily reproducible method to obtain vignettes that have not been altered by the etching processes and that feature little or no defects associated with coalescence boundaries. This embodiment therefore enables to considerably increase the efficiency of the devices obtained from these vignettes. This embodiment can be described as "bottom-up" as it enables to produce components from a bottom face towards a top face, whereas usually, the components are produced according to methods described as "top-down", because they consist in producing components from a top face towards a bottom face.

In the case of microLEDs, this solution enables to improve the brightness of high-resolution screens produced from these microLEDs. Indeed, it enables to obtain microLEDs of very small sizes with a radiative efficiency that has not been altered by the detrimental effects caused by etching. The dimensions of the vignettes are determined by the network of pillars. It is possible to produce vignettes of a few μm to a few hundred μm ($10^{-6}$ metres) by implementing this method.

The precision of the methods implemented to produce the network of pillars determines, at least partially, the smallest dimension possible for the microLEDs, and therefore the resolution of the screen comprising these microLEDs. For example, for networks of pillars produced by nanoimprint lithography and by electron-beam lithography (e-beam), it is possible to achieve pillar sizes of 50 nm and periods of 150 to 200 nm. It is thus possible to obtain vignette sizes of 1 to 2 μm. This corresponds to the sizes of pixels required for high-definition microdisplays (often referred to as μ-displays).

Furthermore, this method enables to directly produce microLEDs that each have a size that corresponds to the initial size of the vignette, in particular if a heterostructure with quantum wells is produced on these nitride vignettes.

This embodiment also enables to obtain vignettes that are used to produce power electronics devices such as diodes or transistors of the HEMT type for example. As the vignettes obtained feature a reduced rate of dislocations and improved crystalline quality, the electric performance levels of the power devices are improved Another aspect of the present invention relates to a microelectronic device wherein each nitride layer or each vignette forms, partially at least, a light-emitting diode (LED), a power diode, or a transistor, for example of the HEMT type.

BRIEF DESCRIPTION OF THE FIGURES

The purposes, objects, characteristics, and advantages of the invention will be made clearer upon reading the detailed description of one of its embodiments, which is illustrated by the following accompanying figures, wherein:

FIG. 4A shows an example of a stack wherefrom an example of a process according to the invention can be implemented. In this non-limiting example, several nitride layers, each forming a vignette, are formed on a substrate.

FIG. 4B shows the stack of FIG. 4A, whereon a primer layer is formed.

FIG. 4C shows the result of a step consisting in forming assemblies of pillars from the stack of FIG. 4A or from the stack of FIG. 4B.

FIG. 4D shows a phase of epitaxial growth of crystallites at the summit of the pillars, this growth phase being uncompleted.

FIG. 4E shows the result of the epitaxial growth of the crystallites, after coalescence of the crystallites supported by the pillars of a same assembly, the crystallites supported by the pillars of a same assembly then forming a vignette.

FIG. 4F shows an optional step of producing multiple quantum wells within each nitride vignette.

Figure 1A:
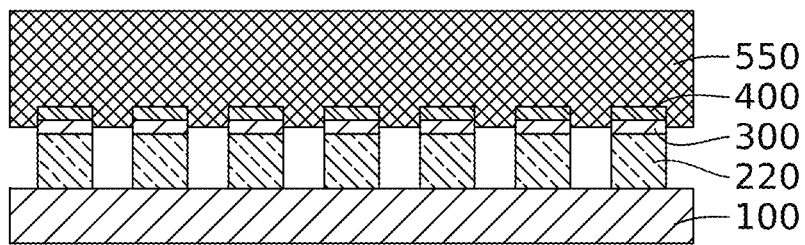
FIG. 1A schematically shows a stack according to the state of the art, comprising a nitride layer formed on pillars.

These figures are provided by way of non-limiting examples of the invention. They are schematic representations of the principle intended to facilitate understanding of the invention and are not necessarily at the same scale as the practical applications. In particular, the relative thickness of the different layers, sections, crystallites, and pillars are not representative of reality.

DETAILED DESCRIPTION

Before beginning a detailed review of the embodiments of the invention, optional characteristics that can be used in association or as an alternative are listed hereunder:

According to one example, the plurality of pillars of the assembly is configured so that $E_R*\Sigma S_{pillarR}>x1*E_S*\Sigma S_{pillarS}$. With, preferably x1=1 or x1≥z1, preferably x1≥1.5, and preferably x1≥2.

According to one example, the plurality of pillars of the assembly is configured so that $E_R*(\Sigma S_{pillarR}/S_R/S_V))>x1*E_S*(\Sigma S_{pillarS}/S_S/S_V))$. With, preferably x1=1 or x1≥1, preferably x1≥1.5, and preferably x1≥2. In these equations:
  $\Sigma S_{pillarR}$ is the sum of the summit surface areas of the at least one retention pillar; $\Sigma S_{pillarS}$ is the sum of the summit surface areas of the separation pillars;
  $E_R$ is the energy required to fracture one surface unit of the at least one retention pillar, $E_S$ is the energy required to fracture one surface unit of the separation pillars,
  $S_R$ is a surface area of a zone of the substrate having a circumference $C_R$ surrounding the at least one retention pillar of the assembly; $S_S$ is a surface area of a zone of the substrate having a circumference $C_S$ surrounding the separation pillars of the assembly, the sum of $S_S$ and $S_R$ being equal to the surface area $S_V$ of a zone of the substrate having a circumference $C_V$ surrounding the retention pillars and the separation pillars of the assembly, the circumference $C_V$ forming a single closed circumference.

The circumferences $C_R$ and $C_S$ are such that when a retention pillar and a separation pillar are adjacent, the circumferences $C_R$ and $C_S$ are equidistant from the retention pillar and from the separation pillar.

According to one example $E_R>E_S$ and preferably $E_R>2*E_S$. In this case, according to one example, the at least one retention pillar does not have a flow section, or has a flow section that is less thick, or less viscoplastic, than that of the separation pillars.

When $E_R>E_S$, according to one example*$(\Sigma S_{pillarR}/S_R)=(\Sigma S_{pillarS}/S_S)$.

When $E_R>E_S$, according to one example $(S_{pillarR}/D_R)=(S_{pillarS}/D_S)$.

According to another example, $E_R=E_S$. In this case, $(S_{pillarR}/S_R)>(\Sigma S_{pillarS}/S_S)$.

According to one example, $S_{pillarR}/D_R>S_{pillarS}/D_S$ and preferably $S_{pillarR}/D_R>2*S_{pillarS}/D_S$. Preferably $S_{pillarR}/D_R>3*S_{pillarS}/D_S$.

According to a first example, the summit surface area $S_{pillarR}$ of the at least one retention pillar is greater, preferably at least two times greater, than the summit surface area $S_{pillars}$ of the separation pillars. If the retention pillar has a circular section, its diameter is greater than that of the separation pillars.

According to a second example, alternative to or combinable with the first example, a distance $D_R$ separating the at least one retention pillar from the pillars adjacent thereto is shorter, preferably by 1.5 times, than the distance $D_S$ separating the separation pillars of the assembly. If the summit surface area $S_{pillarR}$ of the retention pillars is equal to or greater than the summit surface area $S_{pillarS}$ of the separation pillars, then several retention pillars are distributed at a higher density than the separation pillars.

According to one example, $D_S$ is an average distance separating the separation pillars from all the pillars that are adjacent thereto. According to one example, $D_R$ is an average distance separating the at least one retention pillar from all the pillars that are adjacent thereto.

According to one example, when $S_{pillarR}/D_R>S_{pillars}/D_S$, or $(\Sigma S_{pillarR}/S_R)>(\Sigma S_{pillarS}/S_S)$, then $E_R=E_S$. Thus, if the retention pillars and the separation pillars have the same heights and diameters, the same amount of energy causes them to fracture. Preferably, the pillars are formed in sections that have identical heights and materials. This enables to form all the pillars from the same layers, thereby facilitating the manufacturing process.

According to one example, for each assembly, the retention pillars are arranged on a surface area $S_R$ of the nitride layer formed on said assembly of pillars that is smaller than 30% and preferably smaller than 10% of the total surface area $S_{vignette}$ of the nitride layer. The surface area $S_{vignette}$ is measured in a plane parallel with a plane (xy) wherein primarily extends an upper face of the substrate.

According to one example, the number of retention pillars is smaller by 50%, and preferably by 30% than the total number of pillars of the assembly, for example in the event of all the pillars having the same diameter.

According to one example, in the retention zone, the pillars have diameters that are greater than in the separation zone, and the distances between pillars are shorter than in the separation zone. For example, the at least one retention pillar differs from the separation pillars by at least the two following parameters: $S_{pillarR}\geq 1.2*S_{pillarS}$, and $D_R*1.2\leq DS$.

According to one example, each assembly comprises at least 36 pillars, for example for vignettes of 3×3 μm², the number of retention pillars being less than 4. Preferably, the number of retention pillars is less than 3. Preferably, the number of retention pillars is less than or equal to 2. Preferably, there is a single retention pillar per assembly.

According to one example, each assembly comprises a single retention pillar. According to an alternative example, each assembly comprises several retention pillars and the sum $\Sigma S_{PillarR}$ of the summit surface areas $S_{pillarR}$ of the retention pillars of each assembly ranges from 0.000001 to 0.43 times the sum $\Sigma S_{pillarS}$ of the summit surface areas $S_{pillars}$ of the other pillars, for example in the event of not all the pillars having the same diameter.

According to one example, $2.5 \leq d_{pillarR}/d_{pillarS} \leq 10$ with $d_{pillarR}$ and $d_{pillars}$ being the maximum dimension, for example the diameter, of a cross-section of a retention pillar and of a separation pillar, respectively. $d_{pillarR}$ and $d_{pillarS}$ are measured in planes that are parallel with the upper face of the substrate.

According to one example, each assembly comprises at least one zone, called retention zone, comprising the retention pillars, and comprises at least one other zone, called separation zone, comprising the separation pillars. According to one example, the retention zone extends over a surface area smaller than 1/3, and preferably smaller than 1/10 of the surface area of the separation zone.

According to one example, the retention zone is located at the periphery of the assembly. Thus, the retention zone is not surrounded by a separation zone. This allows to control with more reliability the separation of a part of the nitride layer and the retention of another part of the nitride layer.

According to one example, the retention zone is located at the periphery of the assembly. According to one example, preferably, all the retention pillars of an assembly are located in a single, continuous, zone. Thus, the retention zone is not discontinuous. It is not separated from the zones comprising pillars that are not retention pillars.

According to one example, the total surface area $S_V$ of the nitride layer formed by epitaxy on an assembly of pillars is equal to the sum of the surface area of the retention zone $S_R$ and of the surface area of the separation zone $S_S$. In the separation zone $S_S$ there are only separation pillars. In the retention zone $S_R$ there are only retention pillars.

The retention zone can be continuous or not. Thus, if the nitride layer, typically a vignette, comprises a plurality of retention zones, $S_R$ can be equal to the sum of the surface areas of this plurality of retention zones. The same is true for the separation zone, which can be continuous or not.

According to one example, the retention and separation zones differ by a surface density occupied by the at least one retention pillar on the nitride layer relative to a surface density occupied by the separation pillars on the nitride layer. The surface density of the nitride layer occupied by the retention pillars in the retention zone is greater than the surface density of the nitride layer occupied by the separation pillars in the separation zone. Thus, the ratio $R_{density} = [(\Sigma S_{pillarR}/S_R)/(\Sigma S_{pillarS}/S_S)] > 1$, with:

$\Sigma S_{pillarR}$ is the sum of the at least one summit surface area of the at least one retention pillar;

$S_R$ is the surface area of the retention zone;

$\Sigma S_{pillarS}$ is the sum of the at least one summit surface area of the separation pillars;

$S_S$ is the surface area of the separation zone;

Preferably, $R_{density} = [(\Sigma S_{pillarR}/S_R)/(\Sigma S_{pillarS}/S_S)] > 1.5$ and preferably $R_{density} = [(\Sigma S_{pillarR}/S_R)/(\Sigma S_{pillarS}/S_S)] > 3$.

According to one example, preferably for a fixed period of pillars, the summit surface area $S_{PillarR}$ of the at least one retention pillar is greater by at least 1.5 times, preferably at least 3 times, than the summit surface area $S_{pillarS}$ of a separation pillar. The surface areas $S_{pillarR}$ and $S_{pillarS}$ are measured in a plane parallel with a plane (xy) wherein primarily extends an upper face of the substrate.

With $d_{pillarR}$ and $d_{pillarS}$ the maximum dimensions of the section of the retention pillars and of the separation pillars respectively, according to one example, 100 nm $\leq d_{pillarR} \leq$ 500 nm and 50 nm $\leq d_{pillarS} \leq$ 200 nm. According to one example, each assembly comprises a single pillar having a summit surface area $S_{pillarR}$.

According to one example, preferably assuming the pillars have a same surface area, the distance $D_S$ is greater by at least 1.5 times, preferably greater by at least 2 times, and preferably greater by at least 5 times than the distance $D_R$. The distances $D_R$ and $D_S$ are measured in a plane parallel with a plane (xy) wherein primarily extends an upper face of the substrate.

According to one example, 50 nm $\leq D_R \leq$ 650 nm and 250 nm $\leq D_S \leq$ 1000 nm.

According to one example, each assembly comprises a single pillar having a distance $D_R$ from at least one of the pillars that are adjacent thereto.

According to one example, the retention pillars and the separation pillars are configured so as to confirm at least two, and preferably at least three of the following relations:

$E_R \neq E_S$, $D_R \neq D_S$, $S_{pillarR} \neq S_{pillarS}$.

According to one example, each one of these layers has a lower face and an upper face, substantially parallel with an upper face of the substrate. Each layer forms a vignette. All the lower faces of the layers are substantially in a same plane. The same is true for the upper faces.

The summit surface, intended to form a seed layer, can be made by the crystalline section, a buffer layer, or a primer layer.

At least the separation pillars comprise a flow section, formed by a material having a glass-transition temperature $T_{glass\ transition}$. The crystalline section is on top of the flow section. The flow section is made of an amorphous material.

According to one example, the growth by epitaxy is conducted at a temperature $T_{epitaxy}$, such that: $T_{epitaxy} \leq k1 \times T_{glass\ transition}$, with $k1 \geq 0.8$.

According to one example, the flow layer is made of a viscous material. The material is preferably amorphous. It also features a viscoplastic transition. It can thus be described as viscoplastic, its viscoplasticity being characterised by its viscous transition temperature. Preferably, this material is selected among:

a silicon oxide SixOy, x and y being integers, and preferably the flow layer is made of SiO2, a glass, a borosilicate glass, a borophosphosilicate glass (BPSG).

According to one example, the epitaxial growth is conducted at a temperature $T_{epitaxy}$, such that: $T_{epitaxy} \geq k1 \times T_{glass\ transition}$, with $k1 \geq 0.8$ Optionally, the epitaxial growth is conducted at a temperature $T_{epitaxy}$, such that: $T_{epitaxy} \geq k1 \times T_{glass\ transition}$, with $k1 \geq 0.8$.

According to one example, k1=1, and preferably k1=1.5. According to one embodiment example, k1=0.87 or k1=0.9. According to one particularly advantageous example, k1=0.92. Thus, it the flow sections are formed of SiO2, $T_{epitaxy} \geq 1104°$ C., $T_{glass\ transition}$ for SiO2 being equal to 1200° C. According to an even more preferential embodiment example, k1=0.95. According to an even more preferential embodiment, k1=1, and preferably k1=1.5.

According to one example, $T_{epitaxy} \leq k2 \times T_{melting\ min}$, $T_{melting\ min}$ being the lowest melting temperature among the melting temperatures of the sections forming the pillar, with k2$\leq$0.9 and preferably k2$\leq$0.8. According to one embodiment example, k2=0.9. This enables to prevent a diffusion of the species of the material with the lowest melting to temperature. Thus, if the pillar is formed of flow sections made of $SiO_2$ and of crystalline sections made of silicon, $T_{epitaxy} \leq 1296°$ C. Indeed, $T_{melting\ min}$ is equal to the melting temperature of silicon, because the melting temperature of silicon is equal to 1440° C. and the melting temperature of SiO2 is equal to 1970° C. Preferably, k2=0.8.

In the embodiment whereby the pillars are arranged on the substrate so as to form a plurality of assemblies of pillars, and whereby the step of epitaxial growth is halted before the crystallites belonging to two separate assemblies can start to coalesce, so that the layer formed on each assembly forms a vignette, these vignettes being distant from one another, the method can have at least any one of the following characteristics and steps, which can be combined or taken separately:

According to one example, the distance D (D1 or D2) separating two adjacent pillars of a same assembly is smaller than the distance W1 separating two adjacent pillars belonging to two different assemblies. W1>D and preferably W1≥2×D.

According to one example, W1≥k4×D, with k4=1.5, preferably k4=2. This enables to achieve small pixels and a significant integration density if microLEDs are being produced. Preferably k4=5. W1 can be equal 1.5 microns.

Figure 3A:
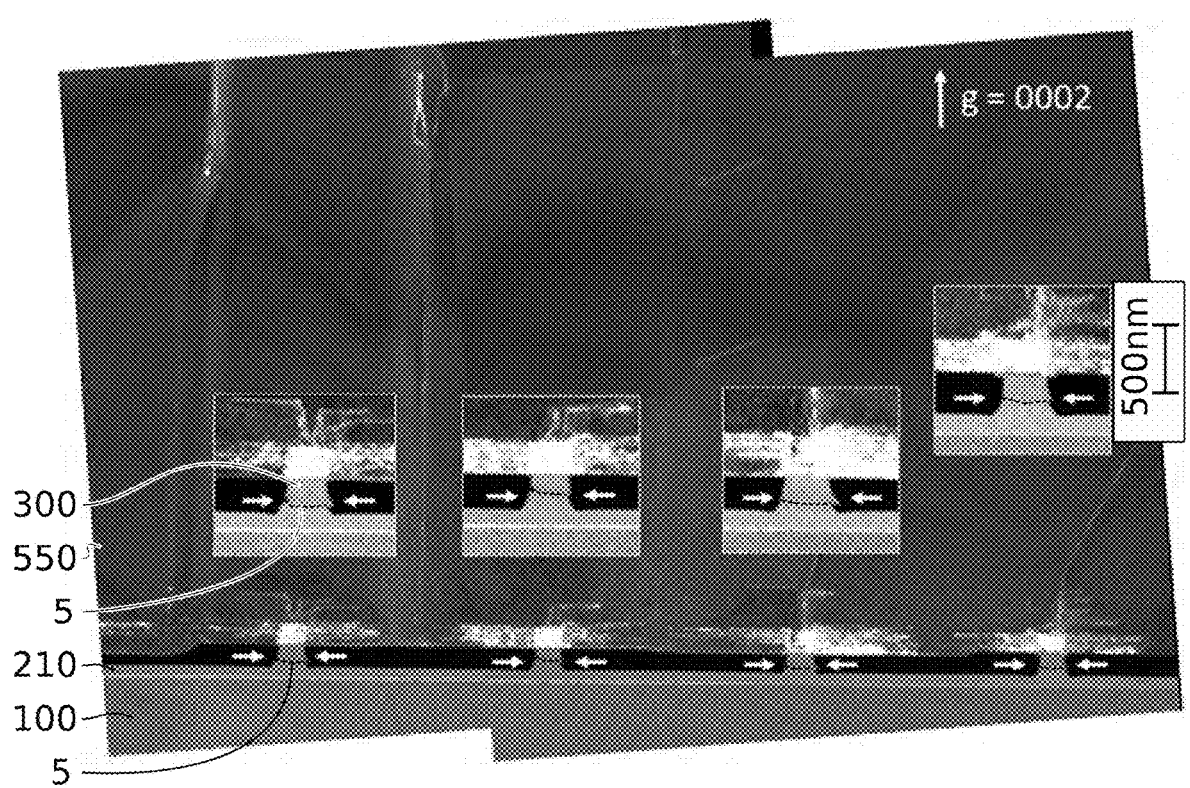
FIG. 3A is a photo obtained by transmission electron microscopy (TEM) showing the apparition of fractures within the pillars.
Figure 3B:
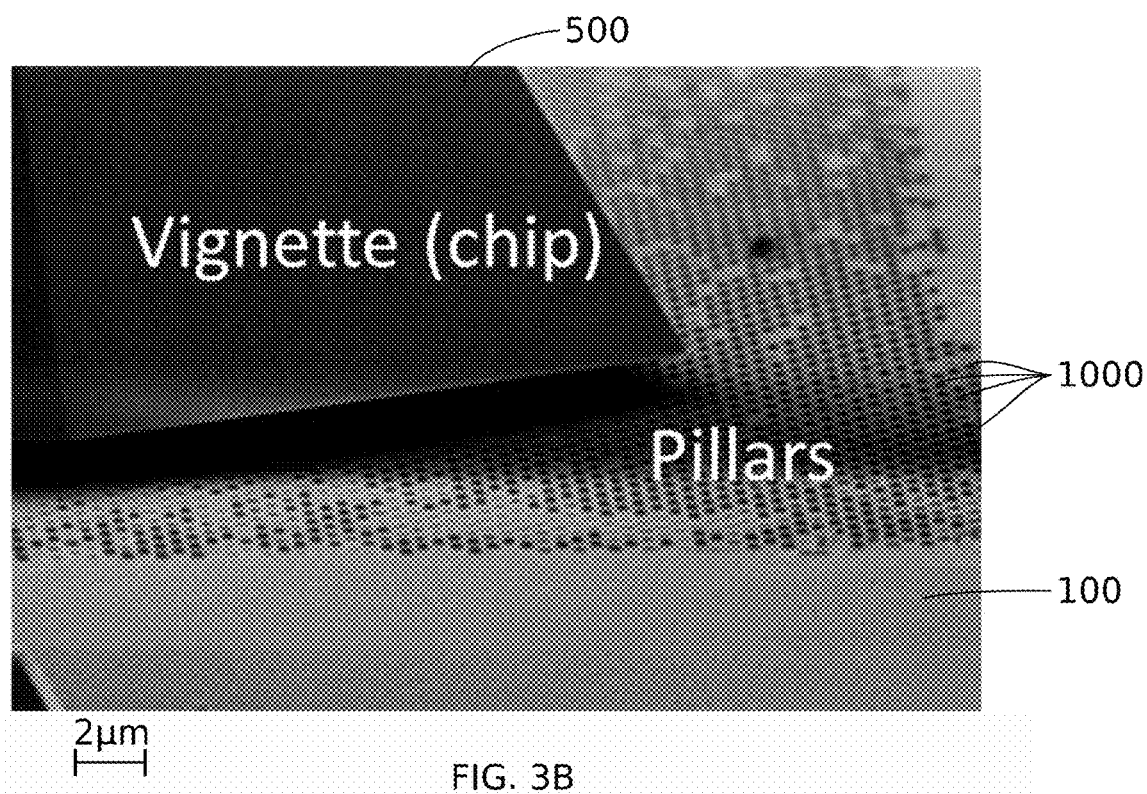
FIG. 3B is a photo obtained by scanning electron microscopy (SEM) showing a vignette involuntarily detached from the substrate after fracturing of the pillars.

W2 being the distance separating two adjacent vignettes (see W2 in FIG. 3D), W2 must be non-nil for the two adjacent vignettes not to touch one another. Thus, W2>0. According to one example, W1≥k5×W2, where:
W1 is the distance separating two adjacent pillars belonging to two separate assemblies;
W2 is the distance separating two adjacent vignettes, W2 being>0. Preferably k5=1.2, preferably k5=1.5, preferably k5=2.

According to one example, each pillar has a section of which the maximum dimension $d_{pillar}$ ranges from 10 to 500 nm ($10^{-9}$ metres), the maximum dimension $d_{pillar}$ being measured in a plane parallel to a plane (xy) wherein primarily extends an upper face of the substrate, preferably 20 nm≤$d_{pillar}$≤200 nm and preferably 50 nm≤$d_{pillar}$≤100 nm. $d_{pillar}=d_{pillarR}$ or $d_{pillarS}$.

According to one example, each vignette has a section of which the maximum dimension $d_{vignette}$ ranges from 0.5 to 20 μm ($10^{-6}$ metres), the maximum dimension $d_{vignette}$ being measured in a plane parallel to a plane (xy) wherein primarily extends an upper face of the substrate, preferably 0.8 μm≤$d_{vignette}$≤3 μm and preferably 1 μm≤$d_{vignette}$≤2 μm. The maximum dimension $d_{vignette}$ thus corresponds to the maximum dimension of a projection of the vignette in a plane parallel to a plane (xy) wherein primarily extends an upper face of the substrate.

Alternatively, the pillars of a same assembly are arranged on the substrate in a non-periodic manner. In an optional but advantageous manner, the tabs are arranged periodically on the substrate.

According to one example, the pillars comprise at least one buffer layer topping the crystalline section and made of a material that is different from that of the nitride vignettes. According to this example, the nitride vignettes are made of gallium nitride (GaN), and the buffer layer is made of aluminium nitride (AlN). This enables to prevent the apparition of the melt-back etching phenomenon generated by the strong reactivity between gallium and silicon.

According to one example, the buffer layer is formed by an epitaxial deposition on top of the crystalline layer, prior to the step of forming the pillars by etching. Thus, the stack comprises, prior to the step of epitaxial growth of the nitride vignettes, at least said buffer layer. Forming the plurality of pillars by etching after having formed the buffer layer on top of the crystalline layer enables to prevent the buffer layer from depositing between the pillars, typically at the bottom of the flow layer, of from depositing on the walls of the sections formed by the crystalline layer, which would have been the case if this step of forming the buffer layer had been completed after the etching of the stack to form the pillars. The epitaxial growth of the nitride vignettes from the flow layer is thus avoided. Naturally, this advantage can be observed when the growth of the nitride layer intended to form each vignette is carried out by selective area epitaxy. This growth indeed occurs on the material of the buffer layer but does not occur on the material of the flow sections. This is the case when the latter are made of $SiO_2$, the buffer layer is made of AlN, and the nitride vignette formed by epitaxy, for example using a MOVPE technique (metalorganic vapour phase epitaxy) is made of GaN. Thus, the latter is not deposited at the foot of the pillars.

According to one example, the pillars comprise, prior to the epitaxial growth of the nitride vignettes, at least one primer layer, on top of said buffer layer and made of gallium nitride (GaN).

According to one example, the stack comprises, before said step of forming the pillars by etching, at least one primer layer, on top of the crystalline section, the primer layer being made from the same material as the nitride layers. Thus, in an embodiment wherein the nitride pillars are made of GaN, the primer layer is also made of GaN. Advantageously, this primer layer enables to facilitate resuming the epitaxial growth to form crystallites. This characteristic is even more advantageous when the surface area of the summit of the pillars is small.

According to one example, each pillar has an upper face, and the epitaxial growth of the crystallites occurs at least partially, and preferably only from said upper face. Preferably, the buffer layer is arranged in direct contact with the upper face of the crystalline section or in contact with the upper face of the section formed by the primer layer.

If the summit of the pillar, i.e., the upper face of the pillar that is laid bare, is formed by the crystalline section, then the crystallites are epitaxially grown directly in contact with the crystalline layer. If the summit of the pillar is formed by the primer layer, then the crystallites are epitaxially grown directly in contact with the primer layer. If the summit of the pillar is formed by the buffer layer, then the crystallites are epitaxially grown directly in contact with the buffer layer. Preferably, the primer layer is arranged in direct contact with the upper face of the crystalline section.

According to one example, at least one among the buffer layer and the primer layer retains a constant thickness during the step of epitaxial growth.

According to one example, producing said stack comprises the production of an elaborate stack of the silicon on insulator (SOI) type, comprising a base substrate topped in sequence by an oxide layer forming said flow layer, and by a semiconducting layer forming said crystalline layer.

According to one example, the flow section has a height $e_{220}$ such that $e_{220} \geq 0.1 \times d_{pillar}$, $d_{pillar}$ being the diameter of the pillar, or more generally the edge-to-edge distance of the pillar measured at the flow section and in a direction parallel with a plane (xy) wherein extends primarily an upper face of the substrate, preferably $e_{220} \geq 1 \times d_{pillar}$. These values enable to obtain a sufficient deformation to reduce the constraints at grain boundaries.

According to one example, the pillars have a height $H_{pillar}$, and two adjacent pillars are distant from one another by a distance D, such that: $H_{pillar}/D<2$ and preferably $H_{pillar}/D \leq 1$.

According to one example, the crystalline section is based on silicon, and preferably the crystalline section is made of silicon.

The crystalline section can also be based on materials other than Si that enable the epitaxy of nitride materials. For example, the crystalline section can be based on SiC or on $Al_2O_3$. These materials are further usable in the form of SiCOI (SiC on Insulator) or of SOS (silicon on sapphire).

According to one embodiment example, the crystalline layer having served to form the crystalline section is a monocrystalline layer.

According to one embodiment example, the flow section is in direct contact with the substrate. The flow layer is in direct contact with the crystalline section. According to one embodiment example, the nitride layer forming each vignette produced by coalescence of crystallites is in direct contact with the crystalline section. According to another embodiment, at least one intermediate layer is produced between the crystalline section and the nitride layer produced by coalescence of crystallites and forming a vignette. This intermediate layer typically forms the buffer layer.

Thus, the flow layer and the crystalline layer are different. The flow layer has a glass-transition temperature. It is therefore made of a glass-transition material and behaves the way glass-transition materials do. Thus, the flow layer is not crystalline. It is made of a viscous or glass material, for example an oxide. The flow layer and the crystalline layer are not made of the same material.

According to one embodiment example, the flow section has a thickness $e_{220}$ of less than 500 nm ($10^{-9}$ metres). Preferably, it ranges from 50 nm to 500 nm, and preferably from 100 nm to 150 nm.

According to one embodiment example, the crystalline layer has a thickness ranging from 2 nm ($10^{-9}$ metres) to 10 µm ($10^{-6}$ metres) and preferably from 5 nm to 500 nm, and preferably from 10 nm to 50 nm.

According to one embodiment example, crystals are epitaxially grown on all the pillars.

According to one embodiment example, the V/III ratio of the fluxes of the epitaxial deposition reactor (the fluxes being for example measured in sccm) of said material comprising nitride (N) and one at least among gallium (Ga), Indium (In), and aluminium (Al) is in the order of 2000.

According to one example, the nitride of the vignettes is gallium nitride (GaN). According to another embodiment, the nitride of the pillars is based on gallium nitride (GaN), and further comprises aluminium (Al) and/or indium (In).

According to another embodiment, the material forming the nitride (N) of the tabs is any element chosen among: gallium nitride (GaN), indium nitride (InN), aluminium nitride (AlN), aluminium gallium nitride (AlGaN), indium gallium nitride (InGaN), aluminium gallium indium nitride (AlGaInN), aluminium indium nitride (AlInN), aluminium indium gallium nitride (AlInGaN).

According to one example, the step of forming the pillars comprises the etching of ito the crystalline layer and the etching of a portion only of the flow layer, so as to keep a portion of the flow layer between the pillars.

According to one example, the pillars are formed so that $d_{crystallite}/d_{pillar} \geq k3$, with $k3=3$, $d_{pillar}$ being the maximum dimension of the section of the pillar measured in a direction parallel with a plane (xy) wherein extends primarily an upper face of the substrate (pillar or more generally the edge-to-edge distance of the pillar, i.e., the maximum dimension of the pillar, regardless of the shape of its section), $d_{crystallite}$ corresponding to the dimension of the crystallite measured along the same direction as $d_{pillar}$ at the moment of the coalescence of the crystallites.

Particularly efficient results were obtained for $k3=3$. According to one example, $100 \geq k3 \geq 3$. Preferably, $50 \geq k3 \geq 3$. Preferably, $5 \geq k3 \geq 3$.

This characteristic enables the flow sections to deform and to withstand, in a particularly efficient manner, the mechanical constraints that occur when two adjacent crystallites begin to coalesce. Thus, this characteristic contributes efficiently to reducing the density of defects within the nitride vignettes that are finally obtained.

Preferably, $P_{pillar}/d_{pillar} \geq 4$, and preferably $P_{pillar}/d_{pillar} \geq 5$. According to one example that yields high-quality results, $P_{pillar}/d_{pillar} = 5$.

The term "microLED" is used to describe a LED with at least one dimension taken in a plane parallel with the main plane wherein extends the substrate supporting the microLED (i.e., the xy plane of the orthogonal coordinates referenced in the figures) that is micrometric, i.e., strictly inferior to 1 mm ($10^{-3}$ metres). For the purpose of the invention, the microLEDs have, in projection in a main extension plane parallel with the main faces of the microLEDs, i.e., parallel with an upper face of the substrate, maximum dimensions of micrometric size in the plane. Preferably, these maximum dimensions are smaller than a few hundreds of micrometres. Preferably, these maximum dimensions are smaller than 500 µm, and preferably smaller than 100 µm.

In the present invention, the term HEMT-type transistor is used to describe high electron mobility transistors, sometimes also described as heterostructure field-effect transistors. Such transistors involve the superposition of two semiconducting layers having different band gaps that form a quantum well at their interface. Electrons are trapped in this quantum well to form a two-dimensional electron gas. For reasons relating to behaviour in terms of high voltage and temperature, the materials of these transistors are selected so as to have a large energy band gap.

In the rest of the description, the terms crystals and crystallites are considered as equivalent.

It should be specified that, for the purpose of the present invention, the terms "on", "is on top of", "covers", or "underlying" or their equivalents do not mean "in contact with". Thus, for example, "the deposition of a first layer on a second layer" does not necessarily mean that both layers are directly in contact with one another but means that the first layer covers at least partially the second layer by being either directly in contact therewith, or by being separated therefrom by at least one other layer or at least one other element, including air. Furthermore, "a pillar on top of a first layer" does not necessarily mean that the pillar is in contact with said first layer but means that the pillar is either in contact with this first layer, or in contact with one or several layers arranged between the first layer and the pillar.

The steps to form the different layers and regions should be understood in their broadest sense: they can be performed as a sequence of sub-steps that are not necessarily successive.

In the following description, the thickness or the height is measured along a direction perpendicular to the main faces of the different layers. In the figures, the height or the thickness is measured along the vertical axis or z-axis of the orthogonal coordinates shown in FIG. 4A.

Similarly, when it is mentioned that an element is arranged opposite another element, it means that both elements are arranged on a same line perpendicular to the main plane of the substrate, or on a same line oriented vertically (z-axis) in the figures.

The term substrate, layer, or device "based" on a material M is used to describe a substrate, a layer, or a device that comprises only said material M, or said material M with possibly other materials, for example alloy elements, impurities, or dopants.

The terms "substantially", "approximately", and "in the order of" mean "in the 10% range", or when it is an angular orientation, "in the 10° range". Thus, a direction that is substantially perpendicular to a plane means a direction having an angle of 90±10° with respect to the plane.

An example of a method for forming a nitride layer is described below in reference to FIGS. 4A to 4F. In this non-limiting example, at the surface of a substrate, a plurality of layers is produced, each forming a vignette.

Figure 4A:
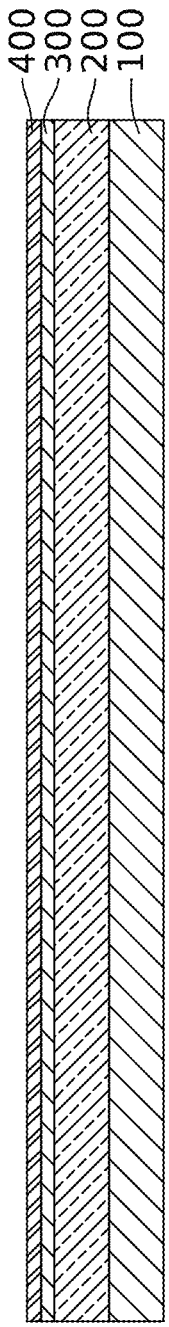
FIG. 4A to 4F show steps of a process according to a non-limiting example of the process according to the present invention.

As shown in FIG. 4A, a stack is provided comprising at least one substrate 100, topped in sequence by a flow layer 200 and a crystalline layer 300. Thus, the flow layer 200 is arranged between the substrate 100 and the crystalline layer 300.

According to one embodiment, the substrate is based on silicon, amorphous, or crystalline. It ensures the stack is mechanically maintained. The crystalline layer 300 has a lower face opposite the flow layer 200 and an upper face that serves as a base layer to grow the nitride vignettes 550A, 550B. For example, the layer that is ultimately sought is a gallium nitride layer GaN. According to one embodiment, the crystalline layer 300 is based on monocrystalline silicon. Alternatively, the crystalline layer 300 can be based on SiC or on $Al_2O_3$.

Preferably, the flow layer is made of an amorphous material. This material is viscous. The flow layer 200 has a glass-transition temperature. It therefore has a glass-transition and behaves like glass-transition materials do. As is the case with all materials having a glass-transition temperature, the flow layer 200, under the effect of a temperature rise, deforms without breaking and without resuming its initial position following a temperature drop. On the contrary, the crystalline layer 300 does not naturally have a glass-transition. The crystalline layer deforms, then dislocates, and can break. Therefore, the flow layer 200 and the crystalline layer 300 are different. The flow layer 200 is not crystalline.

The flow layer 200 is made of an amorphous material, such as an oxide, and preferably a $SiO_xO_y$ silicon oxide, such as $SiO_2$. The role of this layer is further explained in the following description.

In an advantageous but non-limiting way, this stack comprising the substrate 100, the flow layer 200, and the crystalline layer 300 constitutes a substrate of the semiconductor on insulator type, preferably silicon on insulator (SOI). In this case, the flow layer 200 is formed by the layer of buried oxide (BOX) of the SOI substrate.

According to one advantageous embodiment shown in FIG. 4A, a buffer layer 400 is epitaxially deposited on the upper face of the crystalline layer 300. If the vignettes 550A, 550B that are ultimately sought are formed of GaN and the crystalline layer 300 is a silicon-based layer, this buffer layer 400 is typically made of aluminium nitride (AlN). This enables to avoid the melt-back etching phenomenon generated by the very high reactivity between gallium and silicon at usual epitaxy temperatures (1000/1100° C.), leading to a severe degradation of the GaN vignettes 550A, 550B.

Typically, the thickness of the AlN layer ranges from 10 to 100 nanometres ($10^{-9}$ metres).

Figure 4B:
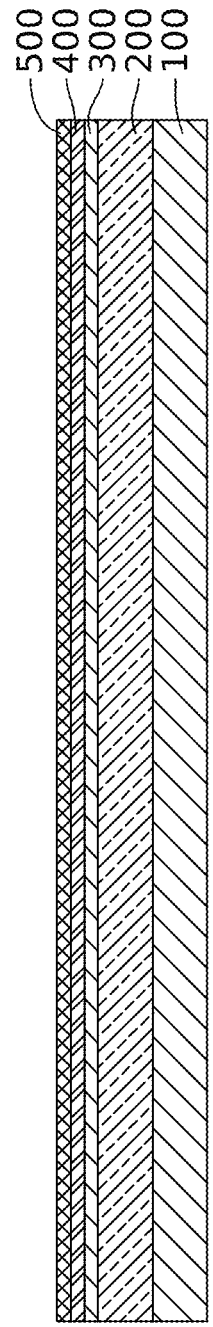

As shown in FIG. 4B, it is also possible to epitaxially deposit a primer layer 500 on the upper layer of the buffer layer 400. The purpose of this primer layer 500 is to facilitate the resumed growth of the crystallites 510 during subsequent steps. In that case, at least part of the epitaxial growth of the crystallites 510A1-510B4 occurs from an upper face of the primer layer 500, said crystallites being shown in FIG. 4D. This primer layer 500 is to preferably made of the same material as that of the vignettes 550A, 550B that are ultimately sought. Typically, when the material of the vignettes 550A, 550B is gallium nitride, GaN, the primer layer 500 is also GaN. This primer layer 500 typically has a thickness ranging from 50 to 200 nanometres.

For the purpose of concision and clarity, only four pillars 1000A1-1000A4 are shown in the figures to support a vignette 550A. Naturally, a vignette 550A can be formed on a greater number of pillars. As is described below, the number of pillars and their period is adapted based on the desired size of the microelectronic device, such as a LED, a transistor (of the HEMT type for example), or a power diode, that will ultimately be produced from that vignette.

It should be noted that the layers 400 and 500 are solely optional. Thus, according to embodiments not shown in FIGS. 4A-4F, it is possible to provide only the buffer layer 400, or only the primer layer 500, or none of the two layers 400 and 500.

Figure 4C:
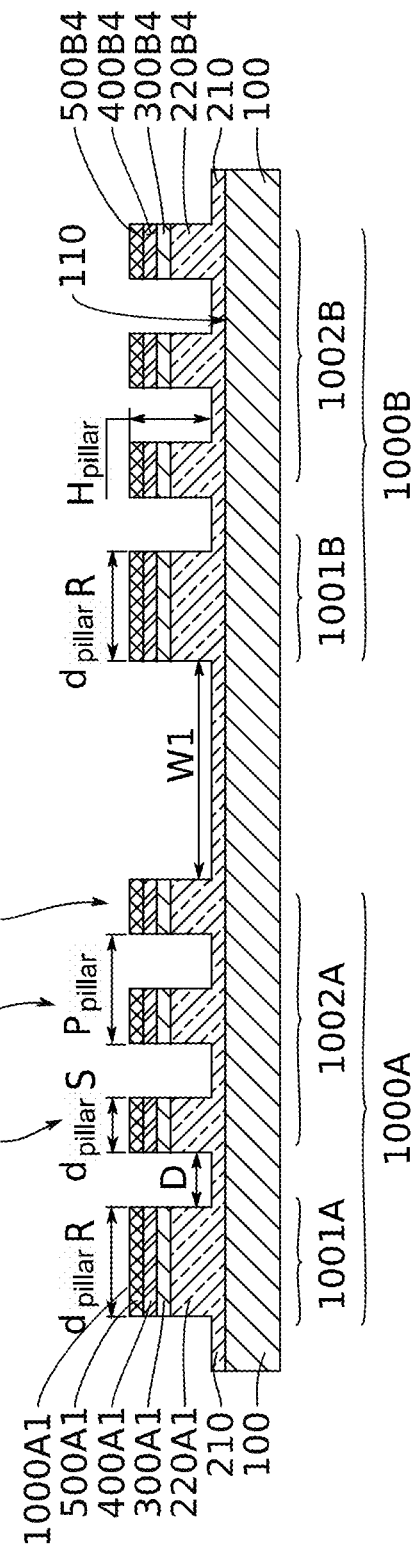

As shown in FIG. 4C, the pillars 1000A1-1000B4 are subsequently formed from the stack. These pillars are obtained by etching of the stack to reach the flow layer 200, at least part of the etching extending within the flow layer 200.

In order to form the pillars by etching, any of the numerous etching techniques known to the person skilled in the art may be used. In particular, traditional lithography techniques may be used, such as photolithography techniques comprising the formation of a mask, for example made of resin, followed by the transfer of the patterns of the mask to the stack. It is also possible to use electron-beam lithography (e-beam) or nanoimprint lithography techniques.

These pillars 1000A1-1000B4 are of small dimensions and can be described as nano-pillars or nano-pillars. Typically, the maximum dimension of the section of the pillars, taken in a plane parallel with the plane xy of the orthogonal coordinates xyz or with the plane of the upper face 110 of the substrate 100 ranges from a few tens to a few hundreds of nanometres. This dimension is noted $d_{pillarR}$, $d_{pillarS}$ depending on the pillars. This dimension is noted $d_{pillar}$ when it relates indifferently to the pillars of a same assembly (thus $d_{pillarS} = d_{pillarR}$ or $d_{pillarS}$). Preferably, $d_{pillar}$ ranges from 10 to 1000 nanometres, and preferably from 20 to 150 nm, and preferably from 50 to 100 nm, for example in the order of 50 nm or of 100 nm. This maximum dimension of the section of the pillars is referenced $d_{pillar}$ in FIG. 4C. If the pillars have a circular section, this maximum dimension $d_{pillar}$ corresponds to the diameter of the pillars. If the pillars have a hexagonal section, this maximum dimension $d_{pillar}$ corresponds to the diagonal or the diameter of the circle intersecting the angles of the hexagon. If these pillars have a rectangular or square to section, this maximum dimension $d_{pillar}$ corresponds to the longest diagonal or to the side of the square.

It should be noted that for each vignette, among the pillars 1000A, 1000B of each assembly, one or several pillars, called retention pillars 1001, differ from the other pillars. For the pillars 1000A, the pillar 1000A1 serves as a retention pillar and the other pillars 1000A2-1000A4 serve as separation pillars and are referenced 1002A2-A4, or more generally 1002. In the example shown in FIG. 4C, for each vignette, the retention pillars 1001A, 1001B have a section $d_{pillarR}$ that is greater than the section $d_{pillarS}$ of the other pillars 1002A, 1002B of the vignette to which they belong. The details and advantages associated with this differentiation of the pillars within a single vignette are described in further detail below.

The pillars 1000A1-1000B4 are not all regularly distributed at the surface of the substrate 100. The pillars 1000A1-1000B4 form assemblies 1000A, 1000B of pillars, each assembly comprising a plurality of pillars. The pillars 1000A1-1000A4 that form a same assembly 1000A define a network of pillars distant from the network of pillars 1000B1-1000B4 forming another assembly 1000B.

Thus, the adjacent pillars 1000A1-1000A4 of a same assembly 1000A are distant by a distance D. The adjacent pillars 1000A4-1000B1 belonging to two distinct assemblies 1000A, 1000B are separated by a distance W1. The distances D and W1 are measured in planes parallel with the plane xy and are shown in FIG. 4C. As is explained below, the pillars 1000A1-1000A4 of a same assembly 1000A are intended to support a single vignette 550A that is distant from another vignette 550B supported by another assembly 1000B of pillars 1000B1-1000B4.

It should be noted that for a same vignette, the distance D may vary. Thus, the pillars 1000A1-1000A4 of a same vignette 550A can be distributed in a non-periodic manner. Their distribution can therefore be adapted to boost the growth of the vignette. For example, if the arrangement of the pillars 1000A1-1000A4 of a vignette 550A is not periodic, there can be a distance D that varies for these pillars 1000A1-1000A4 by more or less 20% or by more or less 10%, for example more or less 10 nm around an average value. According to one example, D can have the following values for a same vignette: 100 nm, 90 nm, 85 nm, 107 nm.

The vignettes 550A, 550B formed on assemblies of pillars 1000A, 1000B distributed in a non-periodic manner can be arranged periodically on the substrate. This facilitates the production of a microdisplay.

According to one embodiment example, the sections of the pillars 1000A1-1000B4, to formed in the flow layer 200, have a height of e220 and, within a same assembly, two adjacent pillars 1000A1, 1000A2 are distant by a distance D, such that:

e220/D<1, and preferably e220/D<1.5. Preferably e220/D<2.

According to one embodiment example, the pillars have a height $H_{pillar}$, and two adjacent pillars are distant by a distance D, such that:

$H_{pillar}$/D<2, and preferably $H_{pillar}$/D<1.5. Preferably $H_{pillar}$/D≤1.

$H_{pillar}$ and e220 are measured along the direction z. D is measured parallel with the plane xy. As shown in FIG. 4C, the pillars are etched through the entire primer layer 500, the entire buffer layer 400 (when these layers are present), and the entire crystalline layer 300. Preferably, only a portion 220 of the flow layer 200 is etched. This embodiment has the advantage of preventing, during the epitaxy, the nitride of the vignettes 550A, 550B from developing on the flow sections 220. This selectivity of the epitaxy occurs in particular when the nitride vignettes 550A, 550B that are being epitaxially grown are made of GaN and the flow sections are made of SiO2. Conversely, if, with the same materials, the flow layer 200 is etched through its entire thickness, then, during the epitaxy, the nitride of the vignettes 550A, 550B develops from the upper face 110 of the substrate 100, usually formed of silicon. This situation is obviously not desirable.

Furthermore, it was observed that the fact of keeping a non-etched portion 210 of the flow layer 200 facilitates the creeping of the section 220, in particular when the crystallites are subject to twist disorientation, i.e., in the main extension planes of the vignettes 550A, 550B that are to be produced. These main extension planes of the vignettes 550A, 550B are parallel with the plane xy of the coordinates xyz.

In a preferred manner, the etched thickness e220, which therefore forms the height of the flow section 220, is equal to at least half the thickness of the flow layer 200. This enables to achieve an excellent reorientation of the crystallites during the formation of the grain boundaries.

Figure 4D:
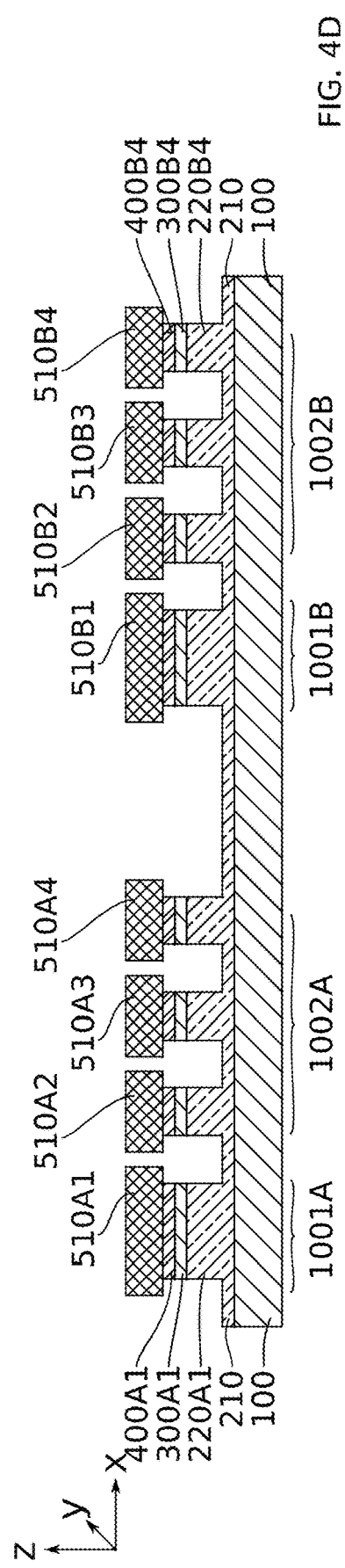

FIG. 4D shows the formation of crystallites 510A1-510B4 by epitaxial growth from a primer layer 500 (or from the upper face of the crystalline layer 300 when the layers 400 and 500 are absent).

As shown in this FIG. 4D, the pillars 1000A1-1000B4 each support a crystallite 510A1-510B4 carried by a stack of sections 400A1-400B4, 300A1-300B4, 220A1-220B4. The sections extend along the main direction of extension of the pillar, i.e., vertically (z) in FIGS. 4A to 4F.

The sections form circular cylinders if the section of the pillars is primarily circular. If to the section of the pillars 1000A1-1000B4 is polygonal, for example hexagonal, the sections then form cylinders with a hexagonal section. Preferably, the sections are full. The section of the pillars is measured parallel with the plane xy, or parallel with the planes wherein the flow layer 220 and the crystalline layer 300 extend primarily.

Regardless of the chosen embodiment, i.e., with or without a primer layer 500 and with or without a buffer layer 400, the epitaxial growth of the crystallites 510A1-510B4 occurs, partially at least or totally, from the upper face of the pillar 1000A1-1000B4, also described as summit of the pillar. Thus, this upper face is formed either by the crystalline section 300A1-300B4, or by the section formed by the primer layer 400A1-400B4, or by the section formed by the buffer layer. In particular, this enables to quickly obtain crystallites 510A1-510B4 with a significant thickness.

It should be noted that the upper faces of the buffer layer 400 and of the primer layer 500, i.e., the layers oriented towards the layer of the vignettes 550A, 550B, which are to be grown, feature polarities of the Gallium (Ga) type, and not of the nitrogen (N) type, which vastly facilitates the production of epitaxially grown nitride vignettes 550A, 550B of high quality.

Figure 4E:
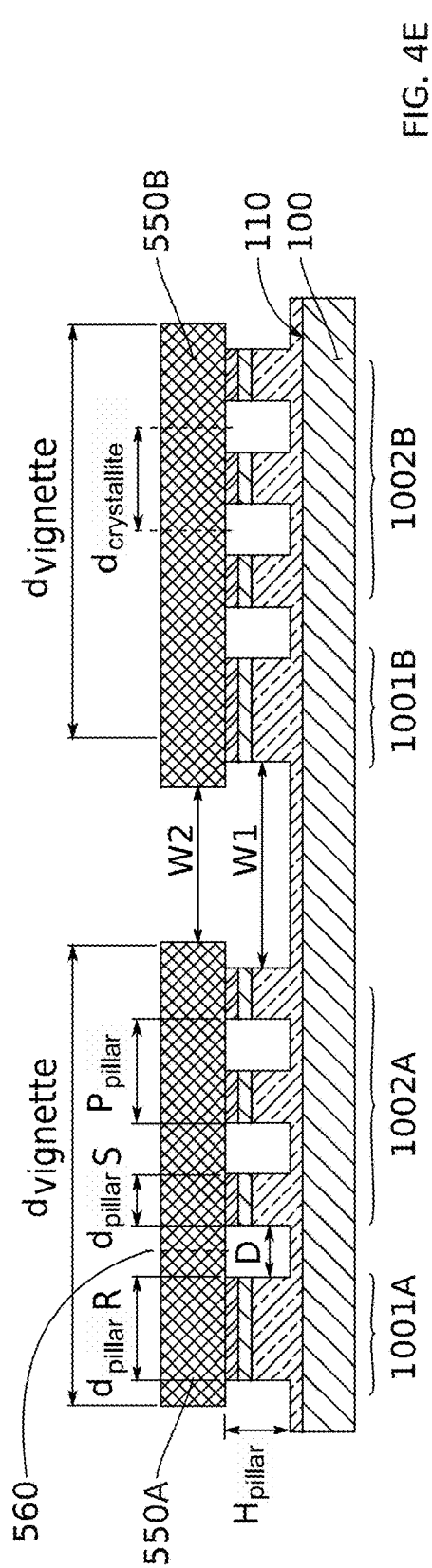

The growth of the crystallite 510A1-510B4 continues and extends laterally, in particular along planes parallel with the plane xy. The crystallites 510A1-510B4 of a same assembly 1000A of pillars 1000A1-1000A4 develop until they coalesce and form a block or vignettes 550A, 550B as shown in FIG. 4E. In other words, and as is shown clearly in the figures, each vignette 550A, 550B extends between several pillars 1000A1-1000A4. Each vignette 550A, 550B forms a continuous layer.

This growth of the crystallites 510A1-510B4 does not extend downwards. Furthermore, this growth is selective as it does not occur on the flow layer 200, which is typically made of an oxide. In that respect, the growth of the crystallites 510A1-510B4 occurs according to the principle of pendeo-epitaxy.

It should be noted that it is particularly advantageous to etch the pillars 1000A1-1000B4 after epitaxially forming the buffer layer 400 and the primer layer 500 (when these layers are present). Indeed, if one of the layers 400, 500 were deposited after the etching, it would form partly at least between the pillars 1000A1-1000B4 on the upper face of the flow layer 200. If the epitaxially grown nitride is GaN and if the flow layer 200 is $SiO_2$, then, at the temperature of epitaxial deposition, the epitaxial growth of the nitride vignettes 550A, 550B would not occur in a selective manner but would also occur between the pillars 1000A1-1000B4, which is naturally not desirable.

In a particularly advantageous manner, the temperature $T_{epitaxy}$ at which the epitaxy is performed is higher than or in the order of the glass-transition temperature $T_{glass\ transition}$ of the flow layer 200. Thus, during the epitaxy, the flow sections 220A1-220A4 are brought to a temperature that allows them to deform.

Consequently, if the crystallites 510A1-510A1 supported by two adjacent pillars 1000A1-1000A2 are disoriented with respect to one another, during the coalescence of these two crystallites, the boundary 560 formed at their interface, usually referred to as grain boundary or coalescence boundary, will form without dislocation, in order to compensate for these disorientations. The deformation of the flow sections 220 thus enables to compensate for these disorientations and to obtain vignettes 550A, 550B with no or little dislocations at the coalescence boundaries. This phenomenon is described in further detail below, in reference to FIGS. 5A to 5D.

Thus, at the end of the step 4E, a plurality of vignettes 550A, 550B is obtained, each vignette 550A being supported by the pillars 1000A1-1000A4 of a same assembly 1000A of pillars. Two adjacent vignettes 550A, 550B are separated by a distance W2, W2 being the shortest distance measured between these two vignettes W2 is measured in the plane) xy.

W2 depends on W1, the duration, and the speed of the epitaxial growth. W2 is non-nil. W2<W1.

$d_{vignette}$ is the maximum dimension of a vignette measured parallel with the plane xy. Thus, $d_{vignette}$ is the maximum dimension of a projection of the vignette in a plane parallel with the plane xy. According to one example, 0.8 µm≤$d_{vignette}$≤3 µm. According to another example, 1 µm≤$d_{vignette}$≤2 µm. According to one example, $d_{vignette}$ ranges from 10 µm to 200 µm. This is the case for example for vertical MOSFET transistors. According to one example, $d_{vignette}$ is in the order of 1000 µm. This is the case for example for HEMT-type power transistors. $d_{vignette}$ depends on the speed and the duration of the epitaxial growth, and on the number, the dimension and the pitch $P_{pillar}$ of the pillars of a same assembly.

The method for producing vignettes 550A, 550B can be halted at the end of the FIG. 4E. Alternatively, this method can be continued to form a device integrating the nitride layer. When the nitride layer forms a vignette, the method can be continued to form for example a microLED, a diode, or a transistor from each of the vignettes 550A, 550B.

Figure 4F:
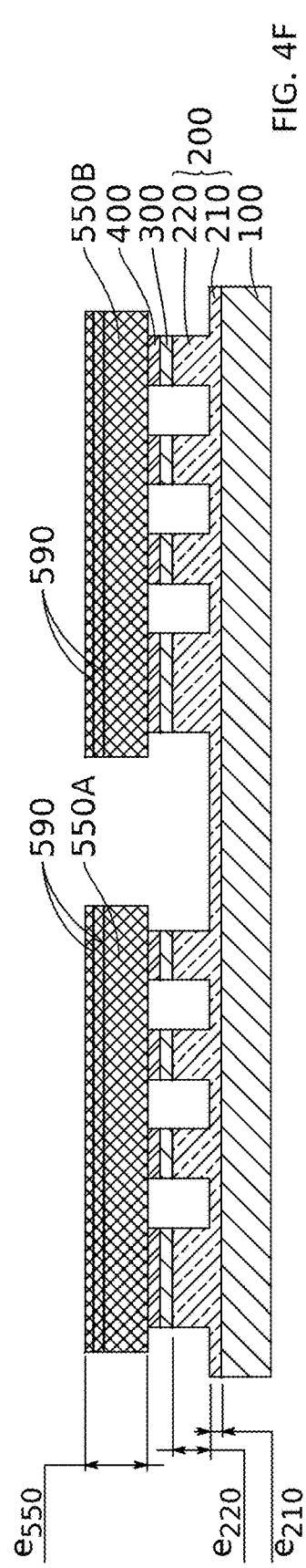

FIG. 4F shows a non-limiting embodiment wherein quantum wells 590 are formed inside each vignette 550A, 550B. This embodiment advantageously enables to produce directly a microLED with a size corresponding to the initial size of the vignette. To produce to quantum wells 590 inside each vignette 550A, 550B, the person skilled in the art may implement the solutions already known in the state of the art. Thus, once the crystallites have coalesced, the same growth conditions are adopted for the wells as during a traditional two-dimensional growth.

The smallest dimension possible for the microLEDs is a function of the resolution that is ultimately to be achieved by the chosen structuring methods: for example, for networks prepared by nanoimprint lithography, it is possible to reach pillar sizes of 50 nm, and periods $P_{pillar}$ of 150 to 200 nm. This means that it is possible to obtain vignette dimensions $d_{vignette}$ of 1 to 2 µm. This is in the pixel size range that is sough for high-resolution µ-displays. In the above example, described in reference to FIGS. 4A to 4F, the pillars 1000 are distributed on the substrate 100 so as to form distinct assemblies 1000A, 1000B so that a nitride layer forms on each assembly and so that the epitaxial growth is interrupted before the different layers come into contact, thereby forming distinct and separate vignettes 550A, 550B on the substrate 100.

Naturally, all the characteristics, steps, and technical advantages mentioned in reference to this embodiment are applicable to an alternative embodiment wherein a single layer is produced on the substrate 100. In this case, it is expected that there is no discontinuity between the assemblies of pillars. In any case, it is expected that the epitaxial growth continues until a continuous layer is formed on the pillars. In this case, it is naturally important to distribute the pillars so that the epitaxial growth from these pillars forms this continuous layer. For example, W1=D et W2=0. Preferably, this layer covers at least 50%, preferably at least 80% of the upper face of the substrate 100.

In each of these two embodiments, i.e., with the formation of a single layer on the substrate, or with the formation of a plurality of layers each forming a vignette, the coalescence occurs without, or with very little dislocations within the nitride layer. In both these embodiments, the single nitride layer or at least some of the vignettes risk separating from the substrate. Providing a retention zone to eliminate this separation risk is therefore particularly advantageous.

Examples of Characteristics to Reduce the Dislocations at the Coalescence Boundaries Generally speaking, to obtain a coalescence of the crystallites without dislocations, it is possible to adjust the following parameters:
- The "mechanical fracture" properties of the material forming the flow section, at a high temperature under relatively low constraints of 500 MPa.
- The sufficiently small size of the support pillars 1000A1-1000A4 compared with the distance D between the pillars of a same assembly 1000A enables to create a constraint in the flow section that is, for a given rotation couple, greater than the "fracture constraint".

Furthermore, as indicated above, it is important to ensure that the epitaxy temperature $T_{epitaxy}$ allows the creeping of the flow section 220. In practice, $T_{epitaxy}$≥600° C. (in the context of molecular-beam epitaxy), $T_{epitaxy}$≥900° C. and preferably $T_{epitaxy}$≥1000° C. and preferably $T_{epitaxy}$≥1100° C. These values enable to reduce in a particularly efficient manner the defects in the epitaxially grown vignette or layer, when the flow layer is made of SiO2. In practice, $T_{epitaxy}$≤1500° C.

To facilitate the formation of coalescence boundaries 560 without dislocation, it is preferable to apply the following conditions:
$T_{epitaxy}$≥k1×$T_{glass\ transition}$, with k1=0.8, preferably k1=1 and preferably k1=1.5.

According to one embodiment example, $T_{epitaxy}$≤k2× $T_{melting\ min}$, $T_{melting\ min}$ being the lowest melting temperature among the melting temperatures of the sections forming the pillar. These are primarily the crystalline section and the flow section. According to one embodiment example, k2=0.9. This enables to prevent a diffusion of the species of the material with the lowest melting temperature.

Thus, if the pillar is formed of flow sections made of $SiO_2$ and of crystalline sections made of silicon, $T_{epitaxy}$≤1296° C. Indeed, $T_{melting\ min}$ is equal to the melting temperature of silicon, because the melting temperature of silicon is equal to 1440° C. and the melting temperature of SiO2 is equal to 1970° C.

According to one embodiment example, the height $e_{220}$ of the flow section is such that $e220 \geq 0.1*d_{pillar}$. These values enable to obtain a sufficient deformation to reduce the dislocations at grain boundaries. $d_{pillar}=d_R$ or $d_S$. According to one example, if $d_{pillar}=d_R$, then $e220 \leq 1*d_{pillar}$, preferably $e220 \leq 0.5*d_{pillar}$.

The pillars 1000A1-1000A4 have a height $H_{pillar}$, and two adjacent pillars 1000A1-1000A2 are separated by a distance D, such that: $H_{pillar}/D<2$ and preferably $H_{pillar}/D \leq 1$. $D_{pillar}=D_R$ or $D_S$. According to one example, if $D_{pillar}=D_R$ then, $H_{pillar}/D \geq 1$ and preferably $H_{pillar}/D>2$.

Advantageously, the step of forming the pillars 1000A1-1000A4 is performed so that $d_{crystallite}/d_{pillar} \geq k3$, $d_{pillar}$ being the maximum dimension of the section of the pillar 1000A1-1000A4 measured in a direction parallel with the plane wherein extends the upper face 110 of the substrate 100. Thus, $d_{pillar}$ corresponds to the maximum dimension of a projection of the pillar in the plane xy. $d_{crystallite}$ corresponds to the dimension of the crystallite measured along the same direction than $d_{pillar}$ when the crystallites 510A1-510B4 coalesce.

According to one example, $100 \geq k3 \geq 1.1$. Preferably, $50 \geq k3 \geq 1.5$. Preferably, $5 \leq k3 \geq 2$.

According to one example, $k3 \geq 3$, preferably $100 \geq k3 \geq 3$. Preferably, $50 \leq k3 \geq 3$. Preferably, $5 \geq k3 \geq 3$.

This characteristic enables the flow sections to deform and to withstand, in a particularly efficient manner, the mechanical constraints that occur when two adjacent crystallites begin to coalesce. Thus, this characteristic contributes efficiently to reducing the density of defects within the nitride vignettes 550A, 550B that are finally obtained. It is important to ensure this characteristic is satisfied at least for the separation pillars.

Figure 1B:
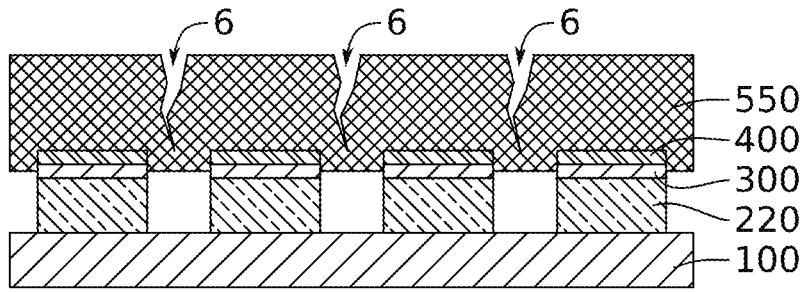
FIG. 1B shows the cracks that appear in the nitride layer of the stack of FIG. 1A, when the nitride layer cools, and the nitride layer has been formed on pillars with a large diameter.
Figure 2A:
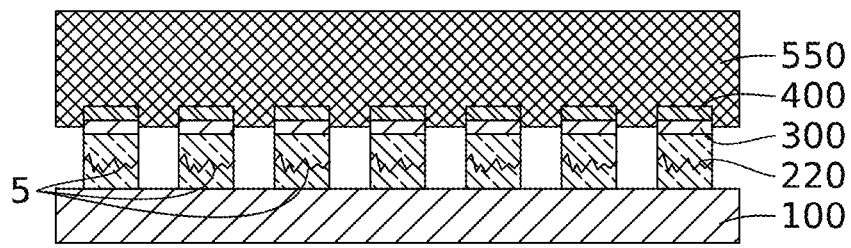
FIG. 2A shows the apparition of fractures within the pillars of the stack of FIG. 1A, when the nitride layer cools, and the nitride layer has been formed on pillars with a small diameter.
Figure 2B:
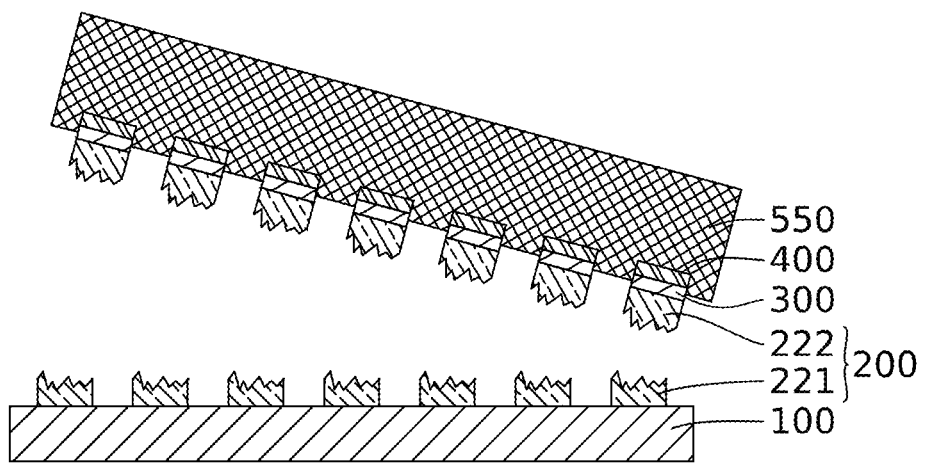
FIG. 2B show the step that follows the step shown in FIG. 2A, with the unwanted detachment of the nitride layer after fracturing of all the pillars.

Reduction of the Risk of Fracture in a Nitride Layer and Improving the Grip of the Nitride Layer As mentioned above in reference to FIG. 1A to 3B, two phenomena can appear after the formation of the nitride layer, and often during the cooling that follows the epitaxial growth:
- if the pillars 1000 are too thick, the nitride layer fractures during cooling because of the CTE differences between the nitride layer and the crystalline section, typically based on silicon. This disadvantage is shown in FIG. 1B.
- If the pillars 1000 are too thin, they fracture during cooling. The nitride layer 550 is then free to move in an unwanted and uncontrolled manner at the surface of the substrate 100, rendering it very difficult to grip. This disadvantage is shown in FIGS. 2A to 3B. This disadvantage is even more detrimental when many nitride layers, each forming a vignette, are formed on the substrate. This phenomenon also depends on the thickness of the nitride layer, typically GaN, that is being grown. In the context of developing the present invention, it was indeed observed that by implementing the method described in document WO2019122461, if the section of the pillars was small, the latter could fracture unexpectedly. Therefore, the layer formed on the pillars becomes detached from the substrate and moves with respect to its initial position. As is shown in FIG. 2A, during the cooling of the nitride layer, fractures appear on the pillars, an in particular on the flow sections of the pillars. The layer can then fully detach from the substrate, as shown in FIG. 2B, in a totally unexpected manner.

In reference to FIGS. 5A to 9B, several embodiments are described in detail below, to explain how to solve these problems.

These solutions rest on the fact that the pillars that serve as supports for the growth of the layer feature differences between one another, in order to:
- on one hand control the fracturing of certain pillars or at least facilitate the fracturing thereof. In the following description, these pillars are called separation pillars and are referenced 1002. These pillars allow the nitride layer to withstand the constraints caused by thermal expansion, without cracking. Furthermore, these pillars allow a partial detachment of the nitride layer from the substrate. These separation pillars prevent an involuntary detachment of the nitride layer from the substrate.
- on the other hand, ensure that at least one of the pillars retains the nitride layer on the substrate. In the following description, this or these pillars are called retention pillars and are referenced 1001. These retention pillars enable to prevent the nitride layer from changing orientation with respect to the substrate, or even from detaching totally therefrom, which renders handling techniques of the pick and place type very delicate to implement.

Each assembly comprises at least one zone, called retention zone 10R, comprising the retention pillars 1001, and comprises at least one other zone, called separation zone 10S, comprising the separation pillars 1002.

In reference to FIGS. 5A to 6E, a first embodiment will be described. In this embodiment, the retention zone or zones 10R have a density of surface occupied by at least one retention pillar 1001 on the vignette (or on the nitride layer) greater than the density of surface occupied on the vignette by the retention pillars 1002 in the separation zones 10S.

According to one example, the ratio $S_{pillarR}/D_R$ and $S_{pillarS}/D_S$, with $S_{pillarR}/D_R > S_{pillarS}/D_S$ and preferably $S_{pillarR}/D_R > 2*S_{pillarS}/D_S$, where
- $S_{pillarR}$ is a summit surface area of the at least one retention pillar (1001);
- $D_R$ is a distance separating the at least one retention pillar (1001) from all the pillars that are adjacent thereto;
- $S_{pillarS}$ is a summit surface area of the separation pillars (1002);
- $D_S$ is a distance separating the separation pillars (1002) from all the pillars that are adjacent thereto;

Preferably $S_{pillarR}/D_R > 1.5*S_{pillarS}/D_S$ and preferably $S_{pillarR}/D_R > 3*S_{pillarS}/D_S$.

In other words, the ratio $R_{density}=[(\Sigma S_{pillarR}/S_R)/(\Sigma S_{pillarS}/S_S)]>1$, where: $\Sigma S_{pillarR}$ is the sum of the at least one summit surface area of the at least one retention pillar 1001; $S_R$ is the surface area of the retention zone; $\Sigma S_{pillarS}$ is the sum of the at least one summit surface area of the separation pillars 1002; $S_S$ is the surface area of the separation zone. Preferably, $R_{density}=[(\Sigma S_{pillarR}/S_R)/(\Sigma S_{pillarS}/S_S)]>2$ and preferably $R_{density}=[(\Sigma S_{pillarR}/S_R)/(\Sigma S_{pillarS}/S_S)]>3$.

To obtain this density of retention pillars 1001, that is greater than the density of the separation pillars 1002, the following should be provided:
- the retention pillar or pillars 1001 have a section with a surface area greater than that of the separation pillars 1002. This embodiment is illustrated in FIGS. 5A to 6E.
- the retention pillars 1001 are distributed at a greater density, i.e., with a smaller period than the separation pillars 1002. This embodiment is illustrated in FIGS. 7A to 8C.

Furthermore, according to another embodiment, these two approaches are combined. Thus, to obtain a density of retention pillars 1001 greater than the density of the separation pillars 1002, both the retention pillar or pillars 1001 having a section greater than that of the separation pillars 1002 and the retention pillars 1001 are distributed at a higher density, i.e., with a smaller period than the separation pillars 1002.

These embodiments are described in further detail below.

According to the first embodiment, the retention pillar or pillars 1002 have a section $S_{pillarR}$ with a surface area that is greater than the section $S_{pillarS}$ of the other pillars. This section is measured in a plane parallel with the upper face 110 of the substrate 100. This surface area for example corresponds to the summit surface area of the pillars. The summit surface area is the surface area of the summit 1010 of the pillar. This surface area extends in a plane parallel with the upper face 110 of the substrate 100. The summit is referenced in FIG. 5A. The summit surface area is intended to come into contact with the nitride layer. It can be made by the crystalline section 300. If a buffer layer 400 is present in the pillar, the summit surface area can be formed by this buffer layer 400. If a primer layer 500 is present in the pillar, the summit surface area can be formed by this primer layer 500.

Preferably, the summit surface area $S_{pillarR}$ of the retention pillar or pillars 1001 is greater, preferably at least two times greater, than the summit surface area $S_{pillarS}$ of the separation pillars 1002.

Figure 5A:
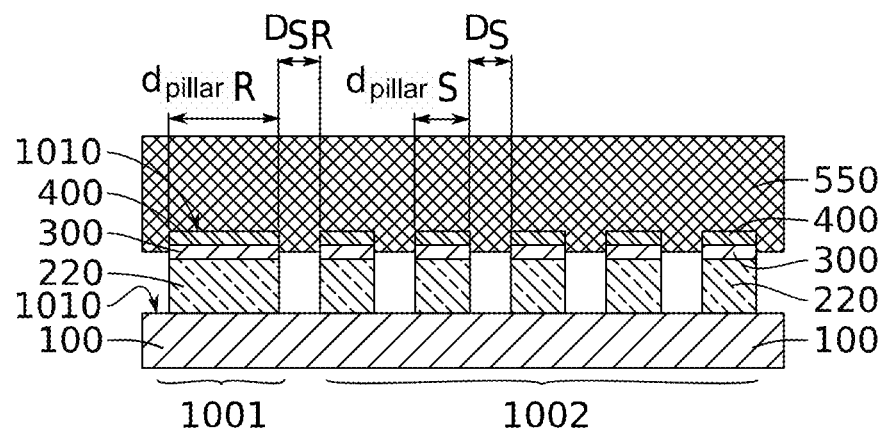
FIG. 5A schematically shows a cross-section view of a stack comprising a nitride layer formed on an assembly of pillars according one embodiment of the present invention. In this embodiment, at least one of the pillars features a diameter that is bigger than that of the other pillars.
Figure 6A:
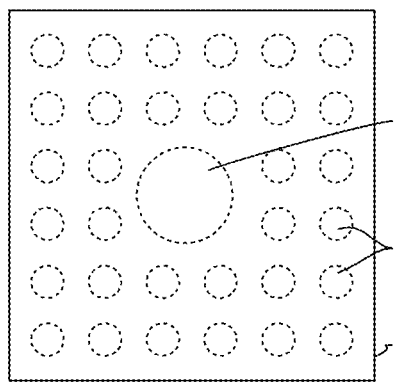
FIGS. 6A to 6E schematically show a top view of examples of stacks wherein one or several pillars feature a diameter that is greater than that of the other pillars.

For the retention pillar 1001, FIG. 5A shows the dimension $d_{pillarR}$ of the section (for example a diameter of the pillar 1001) and FIG. 6A shows the summit surface area $S_{pillarR}$.

For the separation pillars 1002, FIG. 5A shows the dimension $d_{pillarS}$ of the section and FIG. 6A shows the summit surface area $S_{pillarS}$.

Preferably, $d_{pillarR}$ is greater than or equal to 1.5 times $d_{pillarS}$. Preferably, $d_{pillarR}$ is greater than or equal to 3 times $d_{pillarS}$. According to one example, 100 nm≤$d_{pillarR}$≤500 nm and 50 nm≤$d_{pillarS}$≤200 nm.

Preferably, the summit surface area $S_{pillarR}$ of the retention pillar 1001 is greater, preferably at least 1.5 times greater, preferably 3 times greater, than the summit surface area $S_{pillarS}$ of the separation pillar 1002.

According to one example, 10000 nm²≤$S_{pillarR}$≤250000 nm² and 2500 nm²≤$S_{pillarS}$≤40000 nm².

Figure 5B:
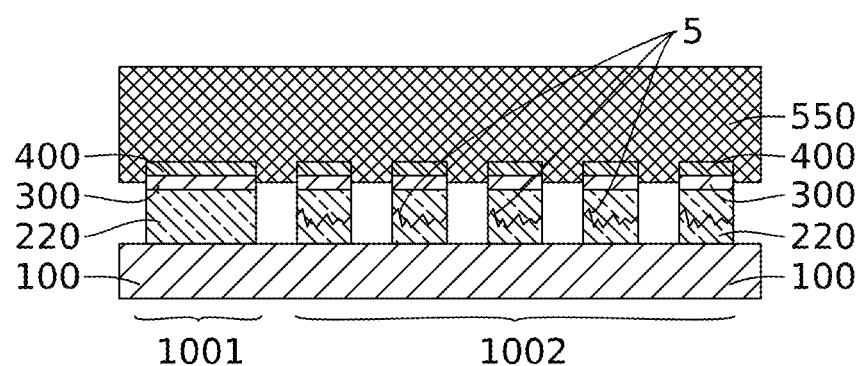
FIG. 5B schematically shows the stack of FIG. 5A after cooling of the nitride layer.

Thus, during the cooling that follows the epitaxial growth, the separation pillars 1002 fracture, as they have a small section and are therefore fragile. These fractures 5 are shown in FIG. 5B. However, the retention pillar or pillars 1001 do not fracture. In any case, the retention pillar 1001 retains the layer 550. The latter does not move, and more importantly does not escape from the substrate 100.

According to one example, such as the one shown in FIGS. 5A and 5B, the pillars 1001 and 1002 are all positioned at the same distance from their neighbours. The retention pillars 1001 differ from the separation pillars 1002 only in their section, and possibly in their materials. Thus, the distance $D_{SR}$ separating the retention pillar 1001 from the separation pillar 1002 adjacent thereto is equal to the distance $D_S$ separating the adjacent separation pillars 1002.

Several arrangements can be provided for the retention pillars 1001. Some examples of these arrangements are shown in FIGS. 6A to 6E. Each of these figures shows in a schematic top view of the layer 550. The pillars 1001, 1002 are therefore shown in dotted lines. In each of these examples, a single nitride layer 550 is shown. However, these examples relate to the embodiment wherein a single nitride layer 550 is formed on the substrate 100, as well as the embodiment wherein several nitride layers 550, each forming a vignette, are formed on the substrate 100.

FIG. 6A shows an example wherein the assembly of pillars supporting the layer 550 comprises a single retention pillar 1001. The retention pillar 1001 is arranged substantially at the centre of the assembly of pillars. The separation pillars 1002 are arranged around the retention pillar 1001. This arrangement has the advantage of accurately controlling the position of the layer 550, because, even in the case of this layer 550 rotating with respect to the substrate 100, this layer 550 will remain centred with to respect to the retention pillar(s) 1001. Furthermore, the retention pillar 1001 being in the centre, the tilt of the produced vignette is reduced.

Figure 6B:
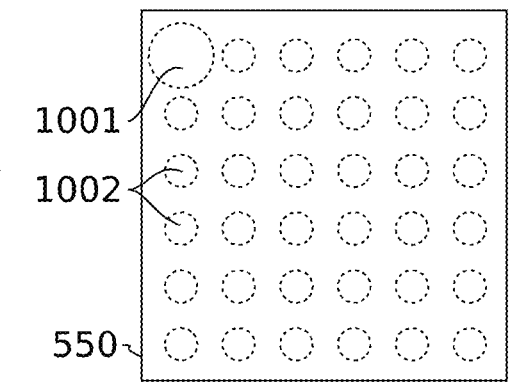

FIG. 6B shows an example that is substantially identical to that in FIG. 6A, but wherein the retention pillar 1001 is located at the periphery of the assembly of pillars, more precisely in a corner of this assembly of pillars. Thus, the retention pillar 1001 retains the layer 550 by one of the corners thereof, in this case the top left corner. This configuration has the advantage, for example, of facilitating the removal of the vignette as shear stresses are applied by pulling on the vignette perpendicularly to the surface.

Figure 6C:
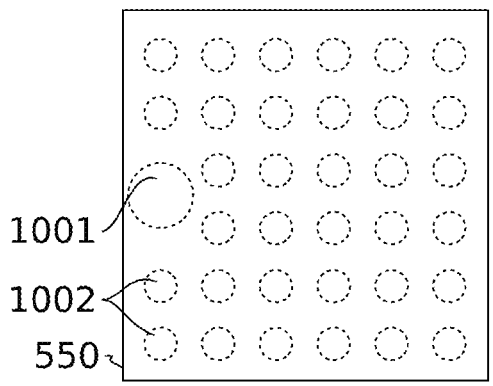

FIG. 6C shows an example that is substantially identical to that in FIG. 6A, but wherein the retention pillar 1001 is located at the periphery of the assembly of pillars, more precisely in the middle of the circumference of this assembly of pillars. This configuration has the advantage, for example, of offering a compromise between the two preceding variants.

Figure 6D:
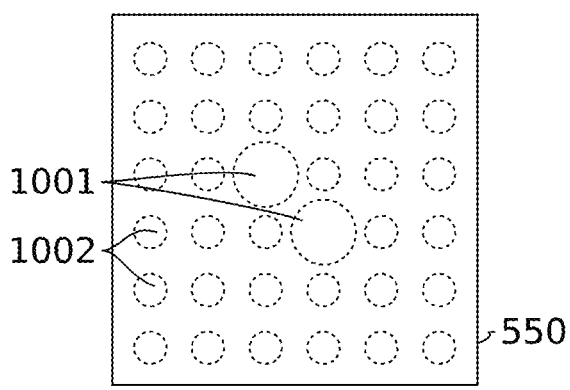
Figure 6E:
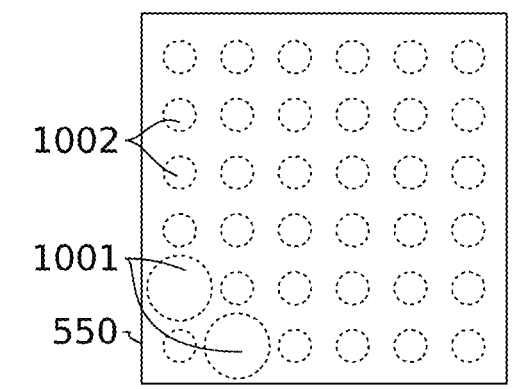
Figure 7A:
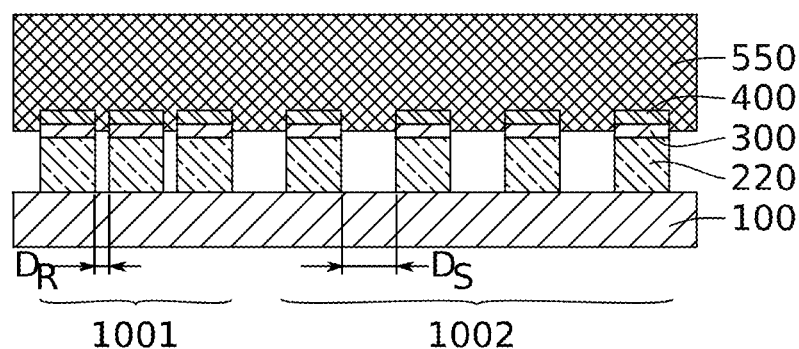
FIG. 7A schematically shows a cross-section view of a structure stack comprising a nitride layer formed on an assembly of pillars according one embodiment of the present invention. In this embodiment, at least some of the pillars are positioned with respect to one another at a higher density than the other pillars.
Figure 7B:
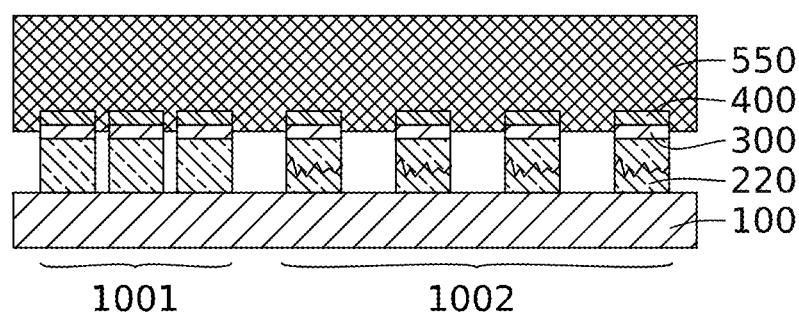
FIG. 7B schematically shows the stack of FIG. 7A after cooling of the nitride layer.

FIGS. 6D and 6E show examples comprising several retention pillars 1001, for example two retention pillars 1001. In these examples, these two retention pillars 1001 are adjacent. These retention pillars 1001 are located at the centre of the assembly of pillars in the example shown in FIG. 6D. These retention pillars 1001 are located in a corner of the assembly of pillars in the example shown in FIG. 6E. These configurations have the advantage, for example, of minimising the size of the pillar required to hold the vignette, and therefore of minimising the constraints in the upper layers.

It is preferable to have several retention pillars 1001 with a reduced section $S_{pillarR}$, for example with a section $S_{pillarR}$ that is identical to the section $S_{pillarS}$ of the separation pillars 1002, rather than having several retention pillars 1001 having a large section $S_{pillarR}$.

Naturally, in all the examples described above, it is possible to add additional retention pillars 1001. Furthermore, it is possible for some of the retention pillars 1001 not to be adjacent to one another. Indeed, it may be preferable that the retention pillars 1001, with a section greater than that of the separation pillars 1002, are not adjacent, in order to avoid a highly constrained zone with respect to its surroundings. Thus, when the assembly of pillars comprises several retention pillars 1001 that differ from the separation pillars 1002 in their section (or the size of their summit surface area $S_R$), it is possible that each retention pillar 1001 is surrounded only by separation pillars 1002.

Conversely, it should be noted that having adjacent retention pillars 1001 enables to control with improved accuracy the zones where these separation pillars 1002 will fracture.

Furthermore, for each example mentioned above, it is possible to ensure that the to pillars 1001 and 1002 are all separated by the same distance ($D_R=D_S$). Alternatively, it is possible that this is not the case. Then, there will be both $S_{pillarR} \neq S_{pillarS}$ and $D_R \neq D_S$.

In reference to FIGS. 7A and 7B and 8A to 8C, a second embodiment will be described. According to this embodiment, the pillar density varies. Thus:
- in at least one first zone 10R of the assembly of pillars, the pillars are separated by a distance $D_R$;
- in at least one second zone 10S of the assembly of pillars, the pillars are separated by a distance $D_S$, where $D_R < D_S$.

Figure 8A:
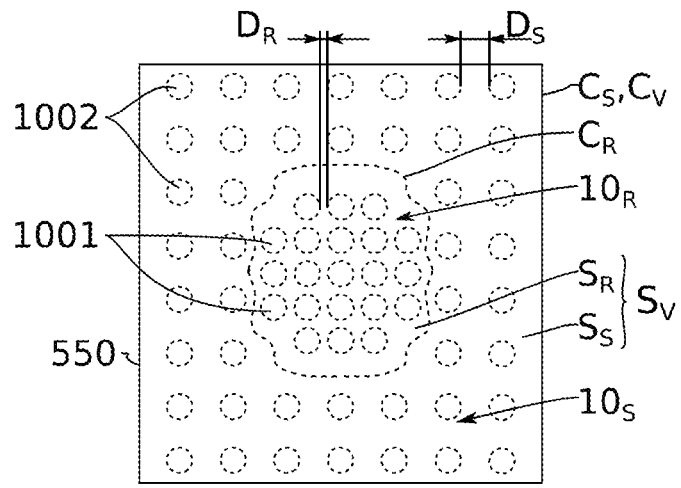
FIGS. 8A to 8C schematically show a top view of examples of stacks wherein some pillars are positioned with respect to one another at a greater density.
Figure 8B:
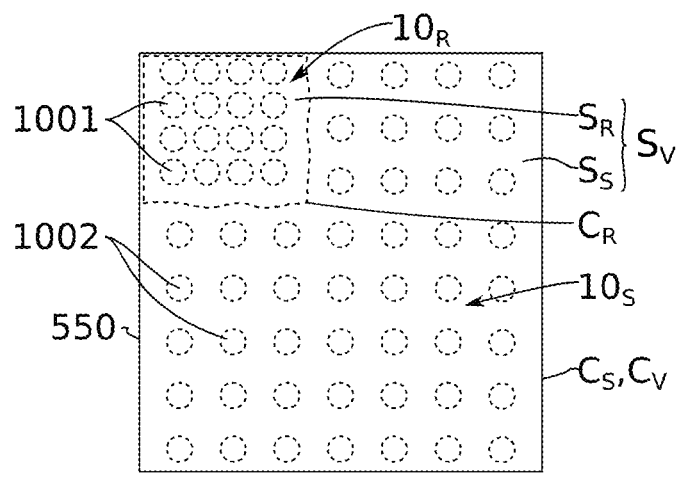
Figure 8C:
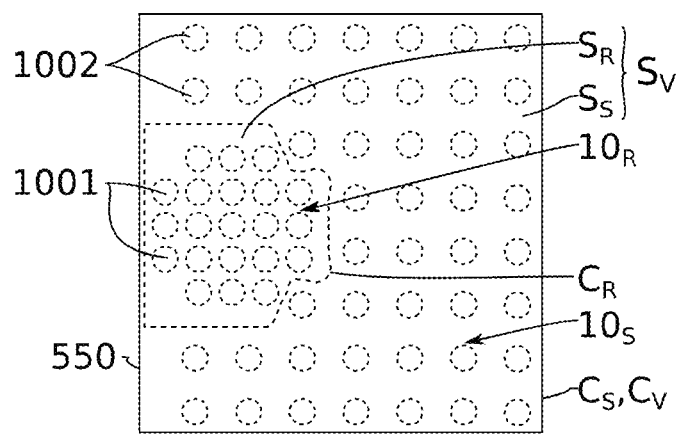

The distances $D_R$ and $D_S$ measured in a plane parallel with the upper face 110 of the substrate 100. The distances $D_R$ and $D_S$ are shown in FIGS. 7A to 8A. The zones DR and DS are shown in FIGS. 8A to 8C. Preferably $D_R$ and $D_S$ are average distances that separate the pillar under consideration from all its neighbouring pillars.

The pillars that are separated from the other pillars by a short distance, i.e., the distance $D_R$, correspond to the retention pillars 1001. Each continuous assembly of retention pillars forms a retention zone 10R. These retention pillars 1001 are indeed organised in a periodic or non-periodic network that has a significant density. This density is, in any case, higher than for the rest of the assembly of pillars. This retention zone 10R prevents the nitride layer 550 from detaching itself from the substrate 100. The separation zone 10S has a lower density of pillars and allows or facilitates the cracking of these pillars 1002.

It should be noted that it is possible that the separation pillars 1002 have different distances $D_R$ within a same assembly of pillars. Similarly, it is possible that the separation pillars 1002 have different distances $D_S$ within a same assembly of pillars. In any case, all the distances $D_S$ are greater, at least 1.2 times greater, and preferably 1.5 times greater, than all the distances $D_R$.

According to one example, the distance $D_S$ is greater, at least 1.2 times greater, preferably at least 1.5 times greater, preferably 2 times greater, and preferably 5 times greater than the distance $D_R$. The distances $D_R$ and $D_S$ are measured in a plane parallel with a plane wherein primarily extends an upper face 110 of the substrate 100.

According to one example, 50 nm $\leq D_R \leq$ 650 nm and 250 nm $\leq D_S \leq$ 1000 nm.

According to one example, the retention zone 10R occupies a surface area $S_R$ that is smaller than 30% and preferably smaller than 20% and preferably smaller than 10% of the total surface $S_V$ occupied by the upper face of the nitride layer 550.

According to one example, $S_R \leq 0.3 * S_S$ and preferably wherein $S_R \leq 0.5 * S_S$.

The retention zone 10R and the separation zone 10Z, whether they are continuous or not, are both defined by circumferences. These circumferences are respectively noted $C_R$ and $C_S$ in FIGS. 8A to 8C. The circumference $C_R$ surrounds all the retention pillars 1001. Inside the circumference $C_R$ there are only retention pillars 1001. The circumference $C_S$ surrounds all the separation pillars 1002. Inside the circumference $C_S$ there are only separation pillars 1002. The circumferences $C_R$ and $C_S$ are defined so that they are equidistant from a retention pillar 1001 adjacent to a separation pillar 1002.

The surface defined by the circumference $C_R$ corresponds to the surface area of the retention zone 10R. This surface is referenced $S_R$ in FIGS. 8A to 8C.

The surface defined by the circumference $C_S$ corresponds to the surface area of the separation zone 10S. This surface is referenced $S_S$ in FIGS. 8A to 8C. In this figure, the total surface $S_V$ is also referenced. $S_V = S_R + S_S$. The circumference $C_V$ forms a single closed circumference, whereas the circumferences $C_R$ and $C_S$ can each form several closed circumferences, for example if the retention pillars 1001 are separated by separation pillars 1002. In places, the circumferences $C_R$ and $C_S$ can be superposed, as a same separation line partially defines these two circumferences. Also, in some places, the circumferences $C_V$ and $C_S$ can be superposed because a part of the circumference $C_V$ is defined by the circumference $C_S$.

The pillars of the assembly 1000A, 1000B are configured so that $E_R^*(\Sigma S_{pillarR}/S_R) > E_S^*(\Sigma S_{pillarS}/S_S)$, preferably $E_R^*(\Sigma S_{pillarR}/S_R) > 1.5 * E_S^*(\Sigma S_{pillarS}/S_S)$ and preferably $E_R^*(\Sigma S_{pillarR}/S_R) > 2 * E_S^*(\Sigma S_{pillarS}/S_S)$.

$\Sigma S_{pillarR}$ is the sum of the summit surface areas of the retention pillar or pillars 1001, in the examples 8A to 8C, there are several retention pillars 1001. $\Sigma S_{pillarS}$ is the sum of the summit surface areas of the separation pillars 1002.

As mentioned above, $E_R$ is the energy required to fracture one surface unit of the at least one retention pillar 1001. $E_S$ is the energy required to fracture one surface unit of the separation pillars 1002.

In the examples shown in FIGS. 8A to 8C, each assembly of pillars supporting a nitride layer 550 comprises only a single retention zone 10R. Naturally, it is possible to have, for each assembly of pillars, and therefore for each nitride layer 550 or vignette 550, a plurality of retention zones 10R. These retention zones 10R can then be separated from one another by separation pillars 1002.

In the example shown in FIG. 8A, the retention zone 10R is located at the centre of the assembly of pillars, and therefore at the centre of the nitride layer 550.

In the example shown in FIG. 8B, the retention zone 10R is located in a corner, here or to the left of the assembly of pillars 1001, 1002.

In the example shown in FIG. 8C, the retention zone 10R is located at the centre of a side of the circumference of the assembly of pillars 1001, 1002.

In these non-limiting examples shown in FIGS. 7A to 8C, the sections $S_{pillarR}$ and $S_{pillarS}$ are identical. However, it is perfectly possible to have non-identical sections $S_{pillarR}$ and $S_{pillarS}$ as well as non-identical distances $D_R$ and $D_S$ as long as the relation $S_{pillarR}/D_R > S_{pillarS}/D_S$ is satisfied.

In reference to FIGS. 9A and 9B, a third embodiment will be described. In this embodiment, the composition, in terms of material(s) and thickness of this or these materials differ between the retention pillars 1001 and the separation pillars 1002. More specifically, the stack of at least one section forming the at least one retention pillar 1001 and the stack of sections forming the separation pillars 1002 are configured, in terms of material and thickness, so that, for an identical section of a pillar, for example a pillar with a diameter of 1 μm, the energy $E_R$ required to fracture one retention pillar 1001 is greater than the energy $E_S$ required to fracture one separation pillar 1002.

According to one example, the energies $E_R$ and $E_S$ are measured by applying one of the well-known methods enabling to identify the minimum energy to cause a fracture or a crack in the material, for example under the effect of a shear of torsional constraint.

According to one non-limiting embodiment:
- the separation pillar or pillars 1002 comprise the flow section 220. The technical characteristics and advantages of this flow section 220 have been detailed above, in particular in reference to FIGS. 4A to 4F.
- the retention pillars 1001 do not comprise a flow section. In this case, the crystalline section can be thicker than that of the separation pillar 1002. It can extend from the substrate 10 to the summit of the pillar 1001 or to the buffer layers 400 and/or primer layers 500, if there are any, as shown in FIGS. 9A and 9B. Alternatively, the retention pillars 1001 comprise a flow section with a height, measured along a direction perpendicular to the plane wherein extends primarily the upper face 110 of the substrate 100, is smaller than the height of the flow section 220 of the separation pillars 1002. In this case, the crystalline section can be thicker than that of the separation pillar 1002.

Thus, the stack is configured so that the separation pillars 1002 crack a lot more easily than the retention pillars 1001.

Figure 9A:
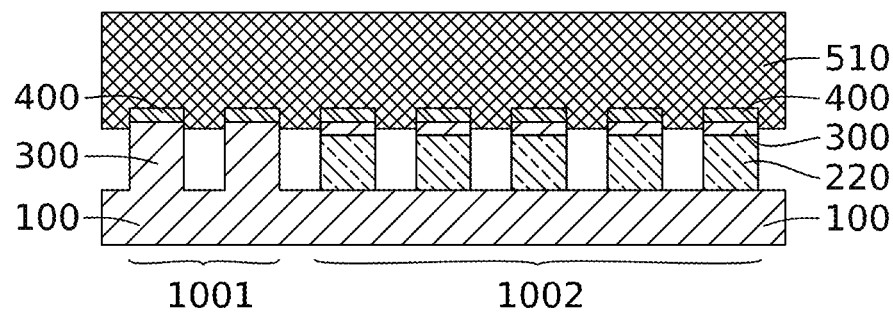
FIG. 9A schematically shows a cross-section view of a stack comprising a nitride layer formed on an assembly of pillars according to one embodiment of the present invention. In this embodiment, at least some of the pillars comprise a flow section, whereas the other pillars do not comprise a flow section.
Figure 9B:
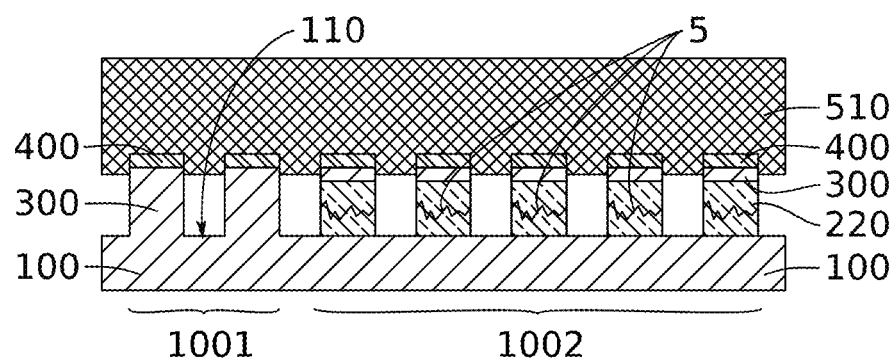
FIG. 9B schematically shows the stack of FIG. 9A after cooling of the nitride layer.

According to one example, corresponding to the example shown in FIGS. 9A and 9B, the crystalline section 300 extends from the base to the summit of the pillar 1001. It is for example possible that the crystalline section 300 forms a material continuity with the to substrate 100.

More generally, it is also possible to have retention pillars 1001 and separation pillars 1002 formed in different materials. The sections of the retention pillars 1001 and of the separation pillars 1002 are then chosen so that the energy $E_R$ required to fracture a surface unit of a retention pillar 1001 is greater than the energy $E_S$ required to fracture the same surface area of a separation pillar 1002. For example, this surface unit can be a pillar or a pillar of 1 µm². Preferably $E_R > 2*E_S$ and preferably $E_R 3*E_S$.

According to another example, when $(\Sigma S_{pillarR}/S_R) > (\Sigma S_{pillarS}/S_S)$ or when $S_{pillarR}/D_R > S_{pillarS}/D_S$, then $E_R = E_S$. The pillars can, for example, then all be formed of sections with identical heights and materials, thereby facilitating the manufacturing process.

In the examples described above in reference to the FIGS. 5A to 9B, the retention pillars 1001 have a single parameter that differentiates them from the separation pillars 1002. This parameter being taken among:
  the surface area of the section of the pillars,
  the density of the pillars, i.e., the distance separating adjacent pillars,
  the materials of the pillars, in particular the presence or absence of a flow section.

Naturally, it is possible for a same assembly of pillars to have at least two of the above differentiating parameters. According to one example, in the retention zone, the pillars have diameters that are greater than in the separation zone, and the distances between pillars are shorter than in the separation zone. For example, the at least one retention pillar differs from the separation pillars by at least the two following parameters: $S_{pillarR} \geq 1.2*S_{pillarS}$, and $D_R*1.2 \leq D_S$.

According to one example, the retention pillars 1001 differ from the separation pillars by the three parameters presented above:
  The fracturing energies per surface unit $E_R$ and $E_S$;
  The summit surface areas $S_{pillarR}$ and $S_{pillarS}$
  The distances between pillars $D_R$ and $D_S$.

For each one of these embodiments, preferably the number of retention pillars 1001 is smaller than the number of separation pillars 1002. Preferably, the number of retention pillars 1001 is smaller than 50%, and preferably smaller than 30% of the total number of pillars 1001, 1002. The total number of pillars is equal to the sum of retention pillars 1001 and separation pillars 1002.

According to one example, the surface occupied by the retention pillars 1001 is ito smaller than 50%, and preferably smaller than 30% of the surface occupied by the assembly of pillars 1001, 1002.

Figure 10:
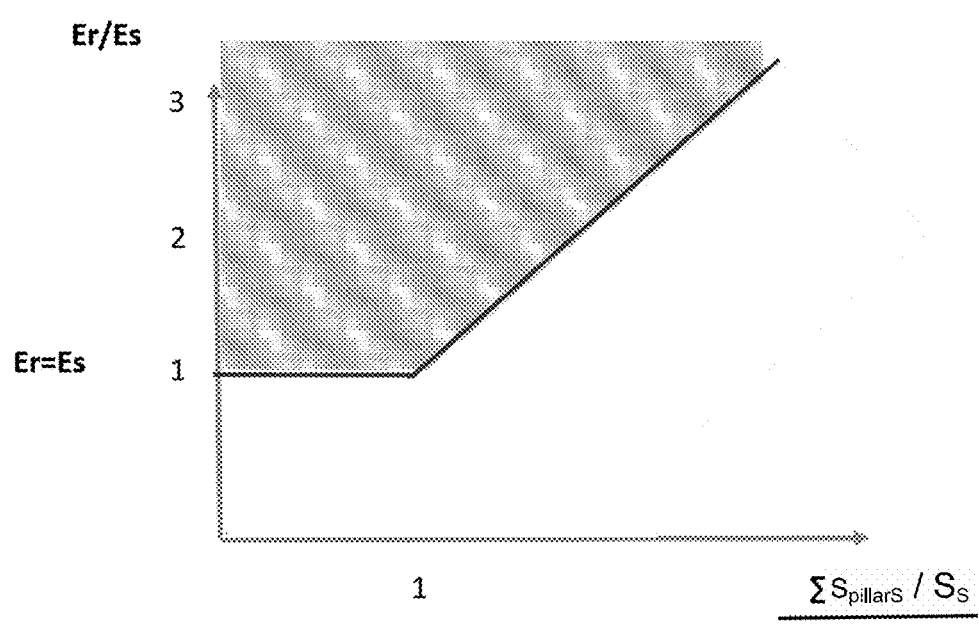
FIG. 10 is a graph that can be used to select the parameters $E_R$, $E_S$, $\Sigma S_{pillars}$, $S_S$, $\Sigma S_{pillarR}$, $S_R$ in order to control the retention of the nitride vignette on the substrate, while also reducing, and even eliminating, the risk of fracturing.

To control the retention of the nitride layer, while reducing the risk of it fracturing, it is also possible to refer to the graph of FIG. 10. In this graph, the ordinate axis corresponds to the ratio $E_R/E_S$. The abscissa axis corresponds to the ratio $(\Sigma S_{pillarS}/S_S)/(\Sigma S_{pillarR}/S_R)$ or to the ratio $(\Sigma S_{pillarS}/(S_S/S_V))/(\Sigma S_{pillarR})/(S_R/S_V))$. In order to satisfy the condition $E_R*(\Sigma S_{pillarR}/(S_R/S_V)) > x1*E_S*(\Sigma S_{pillarS}/S_S/S_V))$, with $x1 \geq 1$, one has to be in the greyed area of the graph in FIG. 10. The graph can therefore be used to select the parameters $E_R$, $E_S$, $\Sigma S_{pillarS}$, $S_S$, $\Sigma S_{pillarR}$, $S_R$.

According to the above description, it clearly appears that the present invention offers a particularly efficient solution to obtain a single nitride layer 550 or a plurality of nitride layers 550 that are epitaxially grown, each intended to form a device such as a microLED, a diode, or a transistor.

The invention is not limited to the embodiments described above and extends to all embodiments covered by the claims.

In particular, in the FIGS. 5A, 5B, 7A, 7B, the flow layer is shown as being discontinuous. Thus, the flow layer does not extend between two consecutive pillars. Naturally, it is possible to have this flow layer extending between two consecutive pillars, as is the case in the example shown in FIG. 4A to 4F.

The invention claimed is:

1. A method for obtaining at least one nitride structure made at least partially of a nitride of at least one element among gallium, indium, and aluminium, the method comprising the following sequence of steps:
  providing a stack comprising a plurality of pillars extending from a substrate of the stack, the pillars being distributed on the substrate so as to form at least one assembly of pillars, each pillar comprising at least:
    a crystalline section, and
    a summit, having a summit surface area configured to form a seed layer for the pillar, and
  growing by epitaxy a crystallite from the summit of some of the plurality of pillars of the assembly and continuing the epitaxial growth of the crystallites until crystallites supported by pillars adjacent to the assembly coalesce, so as to form a nitride layer on the assembly of pillars,
  the plurality of pillars of the at least one assembly comprising at least one retention pillar, and a plurality of several separation pillars, the separation pillars comprising a flow section, formed in an amorphous material with a glass-transition temperature $T_{glass\ transition}$ and a crystalline section disposed on top of the flow section,
  the at least one retention pillar differs from the separation pillars by at least one parameter taken among:
    a summit surface $S_{pillarR}$ of the at least one retention pillar, with $S_{pillarR} \geq 1.2*S_{pillarS}$, $S_{pillarS}$ being a summit surface of the separation pillars,
    the materials constituting the at least one retention pillar and the separation pillars, the retention pillars at least one of:
      not having a flow section,
      having a flow section that is less thick than the flow section of the separation pillars, and
      having a flow section with a glass-transition temperature $T_{glass\ transition}$ that is greater than the glass-transition temperature $T_{glass\ transition}$ of the flow section of the separation pillars, and
    a distance $D_R$, $D_R$ being a distance separating the at least one retention pillar from other retention pillars adjacent thereto and belonging to the assembly of pillars, with $D_R*1.2 \leq D_S$, $D_S$ being a distance separating adjacent separation pillars belonging to the assembly of pillars.

2. The method according to claim 1, wherein the plurality of pillars of the assembly is configured so that $E_R*(\Sigma S_{pillarR}/(S_R/S_V))>x1*E_S*(\Sigma S_{pillarS}/S_S/S_V))$, with $x1>1$, where
$\Sigma S_{pillarR}$ is a sum of the summit surface areas of the at least one retention pillar and $\Sigma S_{pillarS}$ is a sum of the summit surface areas of the separation pillars;
$E_R$ is an energy required to fracture one surface unit of the at least one retention pillar, and $E_S$ is an energy required to fracture one surface unit of the separation pillars;
$S_R$ is a surface area of a zone of the substrate having a circumference $C_R$ surrounding the at least one retention pillar of the assembly; and
$S_S$ is a surface area of a zone of the substrate having a circumference $C_S$ surrounding the separation pillars of the assembly;
$S_V$ is a surface area of a zone of the substrate having a circumference $C_V$ surrounding the retention pillars and the separation pillars of the assembly, the circumference Cy forming a single closed circumference; and
a sum of $S_S$ and $S_P$ is equal to $S_V$.

3. The method according to claim 1, wherein the at least one retention pillar and the separation pillars are configured so that one of:
once the nitride layer is formed the at least one retention pillar retains the nitride layer, and
preferably the at least one retention pillar retains the nitride layer after a cooling of the nitride layer to a temperature at least two times lower than a temperature at which the epitaxial growth occurs.

4. The method according to claim 1, wherein the at least one retention pillar and the separation pillars are configured so that once the nitride layer is formed and after the nitride layer is cooled to a temperature at least two times lower than a temperature whereat the epitaxial growth occurs, at least some of the separation pillars are fractured.

5. The method according to claim 1 wherein the pillars are distributed on the substrate so as to form a plurality of assemblies of pillars, and the step of epitaxial growth growing by epitaxy is halted before the crystallites belonging to two separate assemblies can start to coalesce, so that a layer formed on each assembly forms a vignette, the vignettes being distant from one another.

6. The method according to claim 1, wherein $E_R>E_S$, $E_R$ being an energy required to fracture a surface unit of the at least one retention pillar, and $E_S$ being an energy required to fracture a surface unit of the separation pillars.

7. The method according to claim 6, wherein the retention pillars one of do not have a flow section and have a flow section that is less thick than a flow section of the separation pillars.

8. The method according to claim 1, wherein the summit surface area $S_{pillarR}$ of the at least one retention pillar is at least 1.2 times greater than the summit surface area $S_{pillarS}$ of the separation pillars.

9. The method according to claim 1, wherein 100 nm≤ $d_{pillarR}$≤500 nm and 50 nm≤$d_{pillarS}$≤200 nm, $d_{pillarR}$ and $d_{pillarS}$ being respectively a maximum dimension of the section of the at least one retention pillar and a maximum dimension of the section of the at least one separation pillar.

10. The method according to claim 1, wherein $D_R$ is a distance separating the at least one retention pillar from other retention pillars adjacent thereto and belonging to the assembly of pillars, $D_S$ is a distance separating adjacent separation pillars belonging to the assembly of pillars, and with $D_R*1.5≤D_S$.

11. The method according to claim 10, wherein 50 nm≤ $D_R$≤650 nm and 250 nm≤$D_S$≤1000 nm.

12. The method according to claim 1, wherein for each assembly, $S_R$ is a surface area of a zone of the substrate having a circumference $C_R$ surrounding the at least one retention pillar, $S_S$ is a surface area of a zone of the substrate having a circumference $C_S$ surrounding the separation pillars, a sum of $S_S$ and $S_R$ being equal to a surface area $S_V$ of a zone of the substrate having a circumference $C_V$ surrounding the retention pillars and the separation pillars of the assembly, the circumference Cy forming a single closed circumference, with $S_R$ smaller than 30% of $S_V$.

13. The method according to claim 12, wherein $S_R≤0.3*S_S$.

14. The method according to claim 1, wherein a number of retention pillars is smaller by 50% than a total number of pillars of the assembly.

15. The method according to claim 1, wherein each assembly comprises several a plurality of retention pillars and a sum $\Sigma S_{pillarR}$ of the summit surface areas $S_{pillarR}$ of the retention pillars of each assembly ranges from 1E-6 to 0.43 times a sum $\Sigma S_{pillarS}$ of the summit surface areas $S_{pillarS}$ of the separation pillars.

16. The method according to claim 1, wherein the at least one assembly comprises several retention pillars, all the retention pillars of an assembly being located in a single, continuous zone of the substrate.

17. The method according to claim 1, wherein the retention pillars and the separation pillars are configured so as to confirm at least two of the following relations:
$E_R≠E_S$, $E_R$ being an energy required to fracture one surface unit of the at least one retention pillar, and $E_S$ being an energy required to fracture one surface unit of the separation pillars,
$D_R≠D_S$, and
$S_{pillarR}≠S_{pillarS}$.

18. The method according to claim 1, wherein the epitaxial growth occurs at a temperature $T_{epitaxy}$, such that:
$T_{epitaxy}≥k1 \times T_{glass\ transition}$, with $k1≥0.8$.

19. The method according to claim 18, wherein $k1≥1$.

20. The method according to claim 1, wherein the flow section of the separation pillars is made of a material selected among:
a silicon oxide SixOy, x and y being integers,
a glass,
a borosilicate glass, and
a borophosphosilicate glass.

21. The method according to claim 1, wherein $T_{epitaxy}≤k2 \times T_{melting\ min}$, $T_{melting\ min}$ being a lowest melting temperature among melting temperatures of the sections forming the pillars, with $k2≤0.9$.

* * * * *